(12) United States Patent
Snider et al.

(10) Patent No.: US 7,544,977 B2
(45) Date of Patent: Jun. 9, 2009

(54) MIXED-SCALE ELECTRONIC INTERFACE

(75) Inventors: Gregory S. Snider, Mountain View, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 385 days.

(21) Appl. No.: 11/342,076

(22) Filed: Jan. 27, 2006

(65) Prior Publication Data

US 2007/0176168 A1      Aug. 2, 2007

(51) Int. Cl.
*H01L 27/10* (2006.01)
*H01L 29/73* (2006.01)

(52) U.S. Cl. ...................... 257/208; 257/211
(58) Field of Classification Search ................. 257/208, 257/210, 211, 773–776, 786, E23.01, E23.024, 257/E23.141; 977/707, 712, 762
See application file for complete search history.

(56) References Cited

U.S. PATENT DOCUMENTS

| | | | |
|---|---|---|---|
| 4,486,705 A | 12/1984 | Stopper | |
| 7,256,435 B1 * | 8/2007 | Kornilovich et al. | ........ 257/208 |
| 7,307,271 B2 * | 12/2007 | Islam et al. | .................... 257/14 |
| 2004/0113138 A1 | 6/2004 | Dehon et al. | |
| 2005/0055387 A1 | 3/2005 | Kuekes et al. | |

FOREIGN PATENT DOCUMENTS

| | | |
|---|---|---|
| EP | 1484644 | 12/2004 |
| WO | WO03/063208 | 7/2003 |

OTHER PUBLICATIONS

Ziegler M M et al-"CMOS/Nano Co-Design For Crossbar-Based Molecular Electronics System"-IEEE Transactions on Nanotechnology-vol. 2 No. 4 Dec. 4, 2003-pp. 217-230.
Houel A et al-"Direct patterning of nanostructures by field-induced deposition from a sacanning tunneling microscope tip"-Journ of Vacuum Science & Technology-vol. 20No. 6 Nov. 2002.

* cited by examiner

*Primary Examiner*—Hung Vu

(57) ABSTRACT

Embodiments of the present invention are directed to mixed-scale electronic interfaces, included in integrated circuits and other electronic devices, that provide for dense electrical interconnection between microscale features of a predominantly microscale or submicroscale layer and nanoscale features of a predominantly nanoscale layer. The predominantly nanoscale layer, in one embodiment of the present invention, comprises a tessellated pattern of submicroscale or microscale pads densely interconnected by nanowire junctions between sets of parallel, closely spaced nanowire bundles. The predominantly submicroscale or microscale layer includes pins positioned complementarily to the submicroscale or microscale pads in the predominantly nanoscale layer.

11 Claims, 30 Drawing Sheets

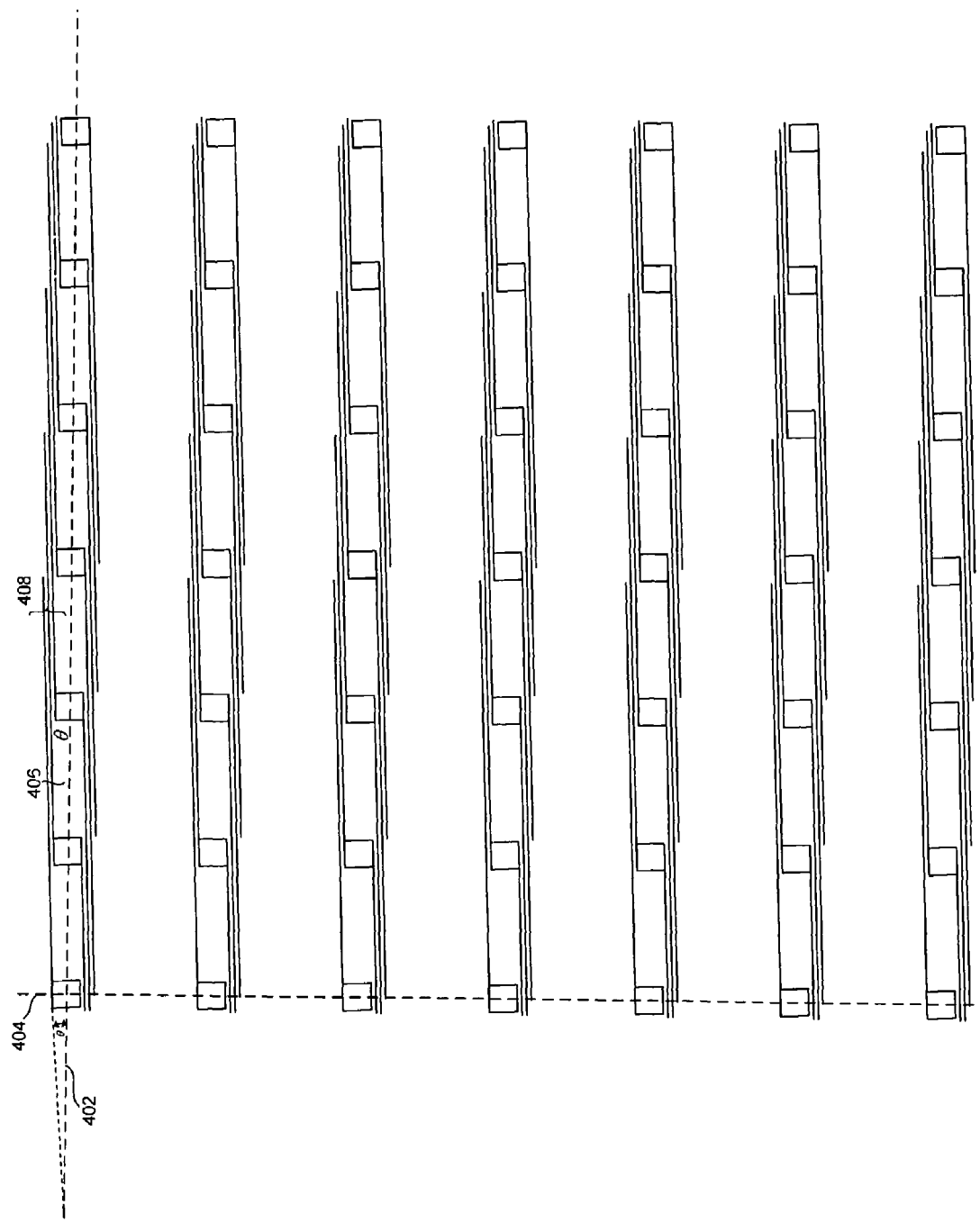

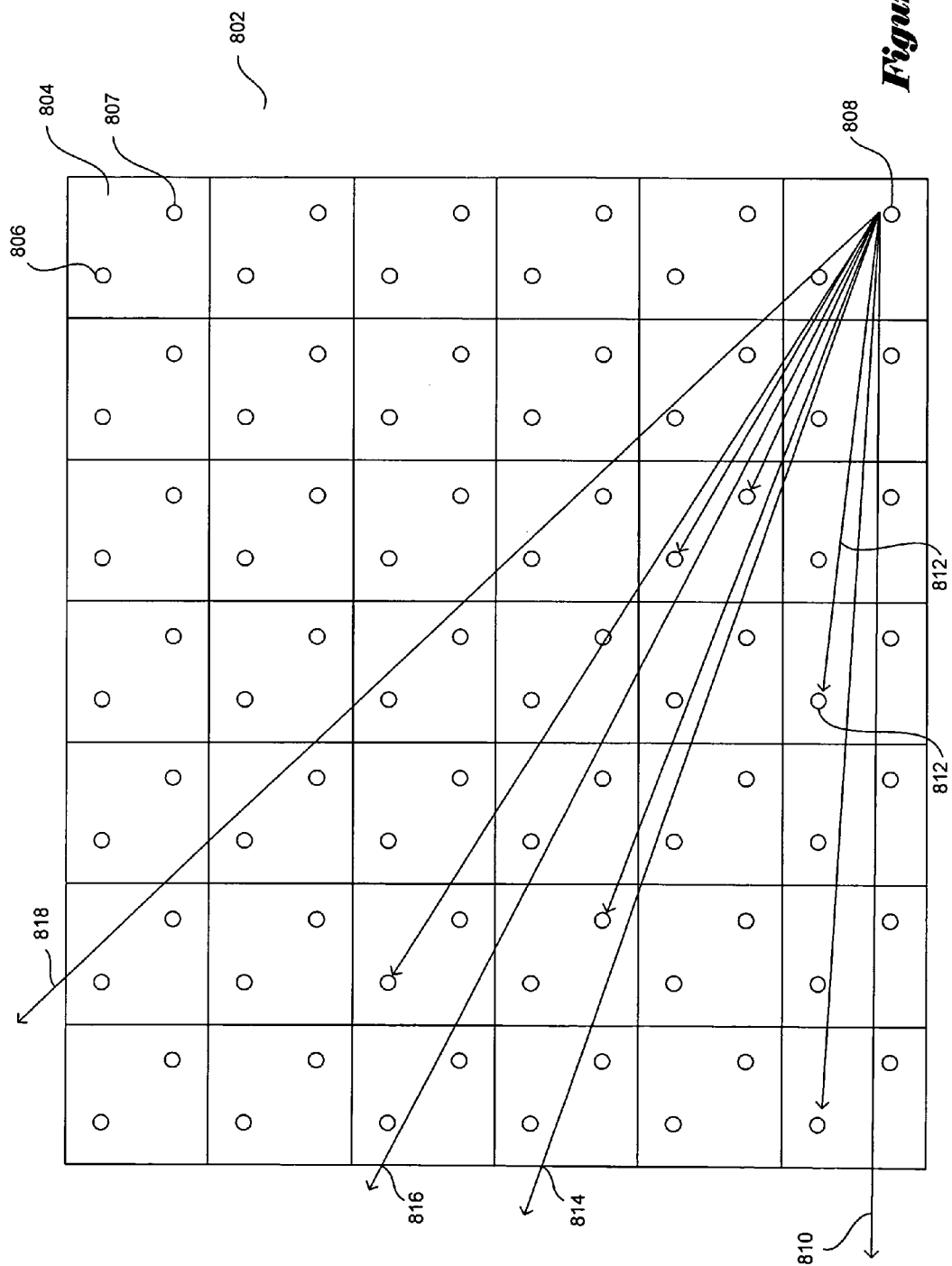

MIXED-SCALE ELECTRONIC INTERFACE

TECHNICAL FIELD

The present invention is related to integrated circuits and other electronic devices and, in particular, to a mixed-scale interface suitable for densely interconnecting nanoscale electronics with microscale electronics within an integrated circuit or other electronic device.

BACKGROUND OF THE INVENTION

As manufacturers and designers of integrated circuits continue to relentlessly decrease the size of integrated-circuit features, such as transistors and signal lines, and to correspondingly increase the density at which features can be fabricated within integrated circuits, they are beginning to approach fundamental physical limits to further decreases in feature sizes for integrated circuits fabricated by conventional photolithography techniques. Research efforts have, during the past decade, turned to new, non-photolithography-based techniques for fabricating nanoscale electronics that allow for fabrication of significantly smaller features than the smallest features currently fabricated by photolithographic techniques. In one approach to designing and fabricating nanoscale electronics, nanowire crossbars comprising multiple layers of parallel nanowires are fabricated by self-assembly or self-orientation with molecular-scale widths on surfaces. The grid-like nanowire crossbars provide a two-dimensional array of nanowire junctions at the closest points of contact between nanowires of a first layer, oriented in a first direction, and nanowires of a second layer, oriented in a second direction approximately perpendicular to the first direction. The nanowire junctions, comprising a small number of molecules of a nanonwire-junction substance, can be fabricated to have properties of resistors, diodes, transistors, and other familiar components of conventional electronic circuits.

Many different prototype nanoscale electronic circuits have been produced in research and development environments, and continued research efforts are producing palettes of nanoscale-electronic components and features of increasing sizes, a rich variety of useful nanoscale-electronic component organizations, and a variety of fabrication methods for producing nanoscale electronic components and devices. However, practical, commercial electronic devices need to include large scale, microscale, and submicroscale components and circuits that interface to nanoscale electronic devices and circuitry. In many cases, devising reliable and cost-effective interfaces between microscale and submicroscale electronics and nanoscale electronics has proven to be more difficult than the design and fabrication of nanoscale electronic devices.

One approach to interfacing microscale and submicroscale electronics to nanoscale electronics involves the use of microscale-to-nanoscale demultiplexers. FIG. 1 illustrates an exemplary demultiplexer/nanowire-crossbar configuration that allows individual nanowire junctions within a nanowire crossbar to be accessed by address signals input to microscale signal lines. As shown in FIG. 1, a first demultiplexer 102 interconnects a small number of microscale address signal lines 104 to a much larger number of parallel nanowires 106 within a nanowire crossbar 108. A second demultiplexer 110 interconnects a second set of microscale address signal lines 112 to a second set of parallel nanowires 114 within the nanowire crossbar 108. Various nanowire junctions may be configured to have particular electronic properties, including properties characteristic of transistors, resistors, diodes, and other such electronic components, represented in FIG. 1 with filled circles, such as filled circle 116, overlying particular nanowire junctions. In the exemplary microscale/nanoscale interface shown in FIG. 1, the four address lines (e.g. address lines 104) input to the demultiplexer can carry any of $2^4$ or 16 different digital patterns, or addresses, of high and low voltage or current binary signals on each address line. The demultiplexer can translate each different perceived address into a pattern of high and low signals output to the nanowires to which it is connected. Typically, a demultiplexer outputs a high, or Boolean "1," signal to a single nanowire corresponding to a four-bit nanowire address received through the microscale address signal lines, and low, or Boolean "0" signals to the remaining, non-addressed nanowires. By arranging the demultiplexers, as shown in FIG. 1, each nanowire junction within the nanowire crossbar can be individually addressed by a pair of addresses, one address received on the first set of address signal lines 104 and a second address received on the second set of address signal lines 112. The nanowire crossbar can be configured arbitrarily to implement any of a large number of different possible circuits which output result signals to selected nanowires. The nanowire crossbar in FIG. 1 is exemplary of the overall organization, and is not intended to represent any particular circuit or device.

Working prototypes of demultiplexer-based microscale/nanoscale interfaces have been developed, and the demultiplexer-based microscale/nanoscale interface has been shown to be a feasible and effective nanoscale/microscale interface technique. However, in general, addressing of a single nanowire by each multiplexer at each instant in time represents a significant bandwidth constriction since, as shown in the example shown in FIG. 1, only one junction may be addressed at a time. Demultiplexer-based nanoscale/microscale interfaces may therefore represent significant bandwidth bottlenecks within mixed-scale microelectronic devices. The demultiplexer-based approach may additionally add design and fabrication overheads, cost, and reliability problems to mixed-scale electronic devices with densely interconnected microscale and nanoscale circuits and functional modules. Therefore, researchers and developers of mixed-scale electronic devices continue to seek more reliable, more easily fabricated, and less bandwidth-constricting nanoscale/microscale interfaces for use in mixed-scale electronic devices.

SUMMARY OF THE INVENTION

Embodiments of the present invention are directed to mixed-scale electronic interfaces, included in integrated circuits and other electronic devices, that provide for dense electrical interconnection between microscale features of a predominantly microscale or submicroscale layer and nanoscale features of a predominantly nanoscale layer. The predominantly nanoscale layer, in one embodiment of the present invention, comprises a tessellated pattern of submicroscale or microscale pads densely interconnected by nanowire junctions between sets of parallel, closely spaced nanowire bundles. The predominantly submicroscale or microscale layer includes pins positioned complementarily to the submicroscale or microscale pads in the predominantly nanoscale layer. More complex mixed-scale electronic interfaces that include two or more microscale or submicroscale layers and/or two or more nanoscale layers can also be designed and fabricated according to methods of the present invention.

BRIEF DESCRIPTION OF THE DRAWINGS

FIGS. 4A-D illustrate the overall organization and patterning of one class of two-layer nanoscale/macroscale-interface embodiments of the present invention.

FIG. 8 shows a rectilinear grid of square microscale cells, each cell containing two different microscale pins.

DETAILED DESCRIPTION OF THE INVENTION

Embodiments of the present invention are directed to nanoscale/microscale interfaces that permit dense interconnections between microscale and submicroscale features and logic and nanoscale features and logic within an integrated circuit or other electronic device. In the current discussion, the term "nanoscale" refers to features and components with a least-one dimension smaller than 100 nanometers. Alternatively, the term "nanoscale" may refer to features and components with at least one dimension smaller than 50 nanometers, and, in certain cases, less than 10 nanometers. The term "submicroscale" generally refers to features and components with at least on dimension smaller than 1 micron, and the term "microscale" refers to features and components with dimensions equal to, or greater than, 1 micron. In general, microscale and submicroscale features and components can be fabricated by conventional photolithographic techniques, but nanoscale components and features can generally be fabricated, currently, using nanoimprint techniques or other non-photolithographic techniques. A described nanoscale/microscale-interface embodiment of the present invention interconnects pads in a predominantly nanoscale layer with correspondingly regularly patterned microscale or submicroscale pins in a predominantly submicroscale or microscale layer. Each pad in the predominantly nanoscale layer may be interconnected through nanowire-junctions with a large number of neighboring pads through nanowire junctions in lattice-like channels of nanowires. A pad within the predominantly nanoscale layer can be accessed by conventional submicroscale or microscale electronics in the second, predominantly microscale or submicroscale layer via a submicroscale or microscale pin.

Figure 1:
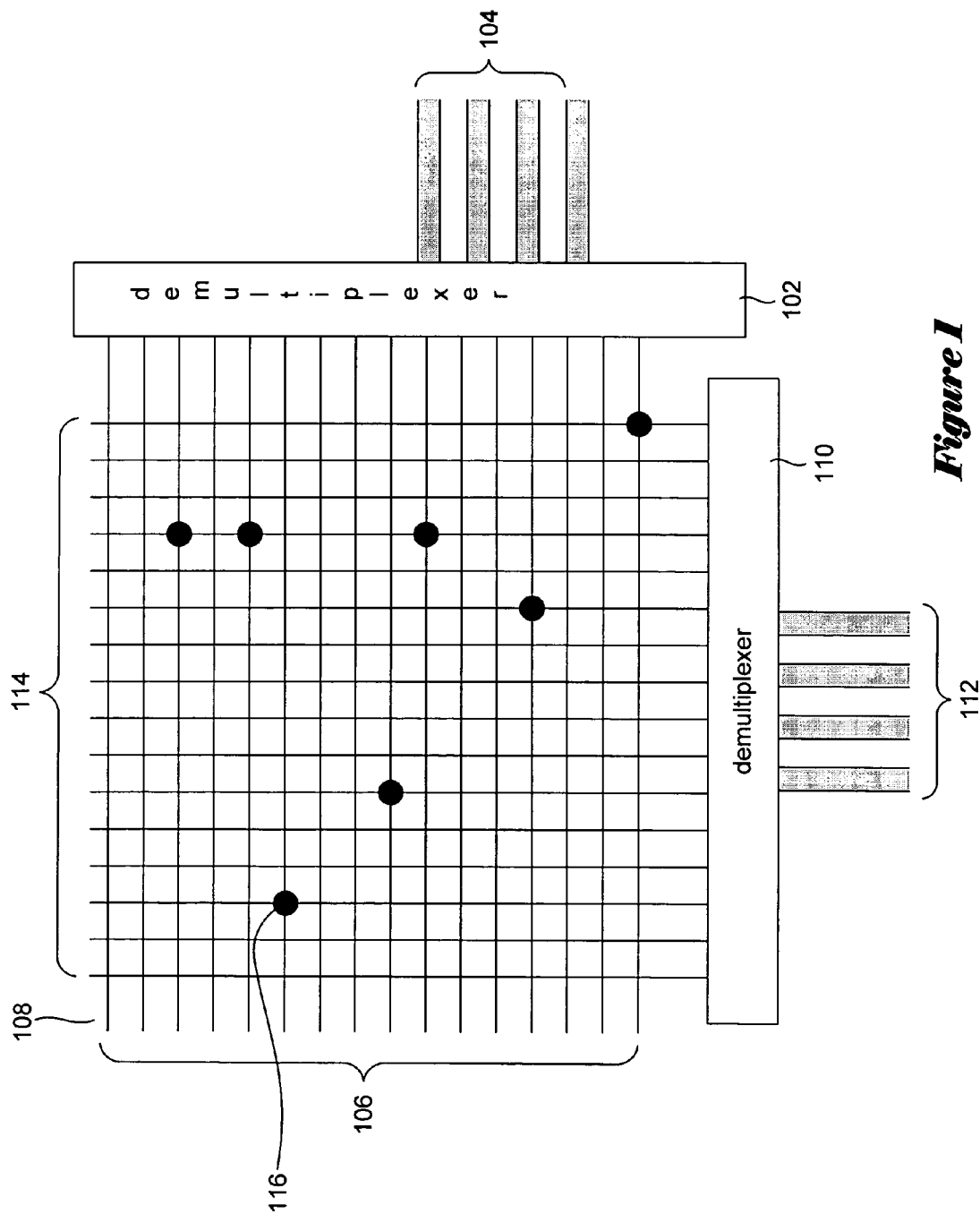
FIG. 1 illustrates an exemplary demultiplexer/nanowire-crossbar configuration that allows individual nanowire junctions within a nanowire crossbar to be accessed by address signals input to microscale signal lines.
Figure 2:
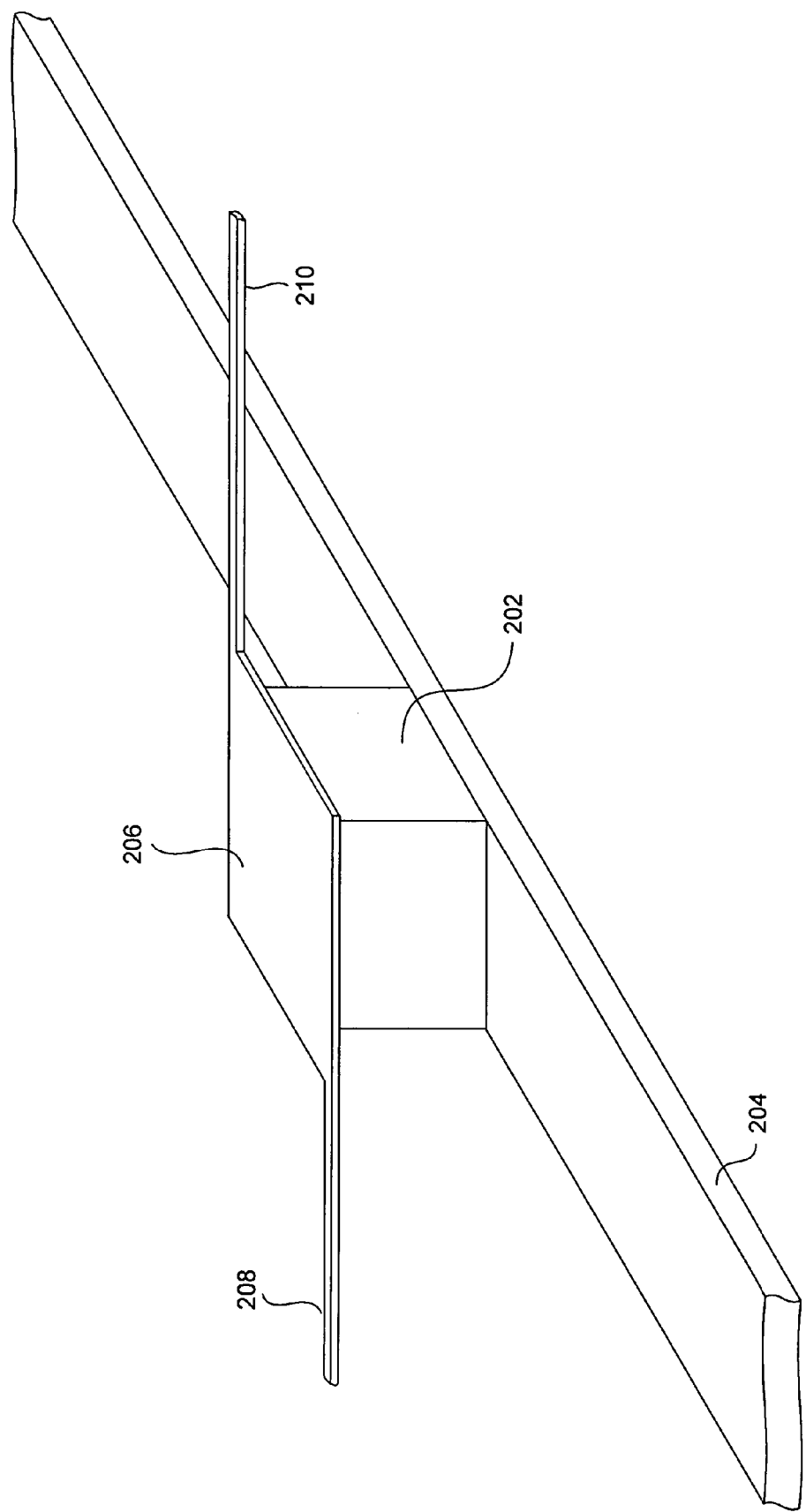
FIG. 2 illustrates a single pin/pad interface within a two-layer nanoscale/macroscale-interface embodiment of the present invention.

FIG. 2 illustrates a single pin/pad interface within a two-layer nanoscale/macroscale-interface embodiment of the present invention. As shown in FIG. 2, a submicroscale or microscale pin 202 connects to a submicroscale or microscale signal line 204. The pin 202 and signal line 204 are both embedded within the predominantly submicroscale or microscale layer of the two-layer nanoscale/microscale-interface embodiment of the present invention. The pin 202 also electrically contacts a pad 206 that is, in turn, interconnected with a first nanowire 208 and a second nanowire 210. The pad 206 and attached nanowires 208 and 210 together compose a pad-interconnected-nanowire unit ("PINU") of one sub-layer of the predominantly nanoscale layer of the two-layer nanoscale/macroscale-interface embodiment of the present invention.

Figure 3:
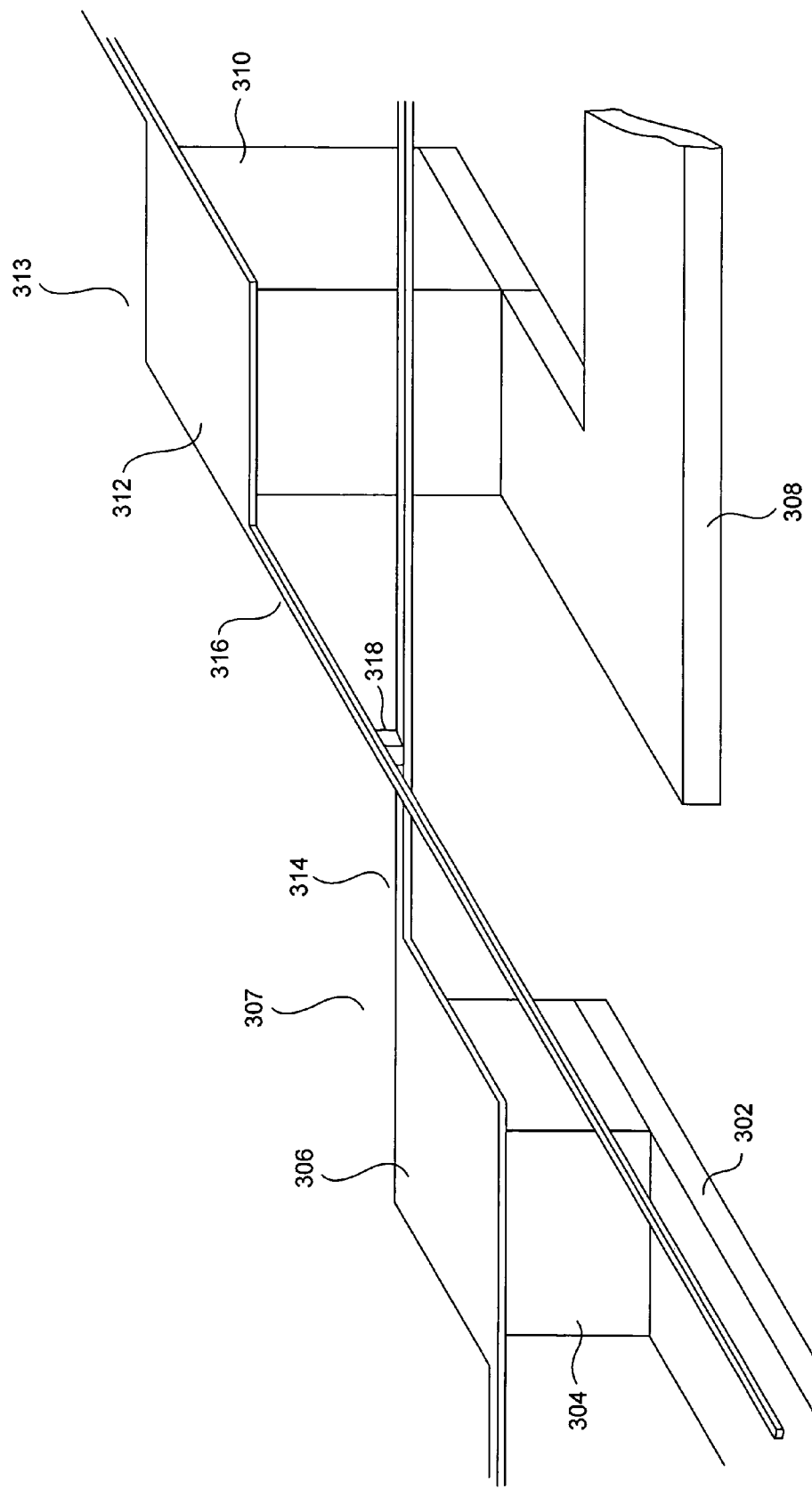
FIG. 3 illustrates, in the same fashion as FIG. 2, two pin/pad interfaces interconnected by a nanowire junction within a nanoscale/microscale-interface embodiment of the present invention.

FIG. 3 illustrates, in the same fashion as FIG. 2, two pad/pin interfaces within a nanoscale/macroscale-interface embodiment of the present invention. In FIG. 3, a first microscale or submicroscale signal line 302 electrically contacts a first pin 304. The first pin also electrically contacts the pad 306 of a first PINU 307. The first PINU 307 resides in a first sub-layer of the predominantly nanoscale layer of the nanoscale/macroscale interface. A second submicroscale or microscale signal line 308 electrically contacts a second pin 310. The second pin also electrically contacts the pad 312 of a second PINU 313. The second PINU 313 resides within a second sub-layer of the predominantly nanoscale layer of the two-layer nanoscale/macroscale interface. Two nanowires 314 and 316 of the two PINUs 307 and 313 intersect at a nanowire junction 318, which, like the nanowire junctions in nanowire crossbars, may comprise one or a small number of molecules that implement a passive or active nanoscale electrical component, such as a resistor, a variable-resistance resistor, a diode, a transistor, or other passive or active component.

In many embodiments of the present invention, pairs of pins of the predominantly microscale layer of a two-layer nanoscale/microscale interface are electrically interconnected via a pair of PINUs and a single nanowire junction. In certain types of electronic devices that incorporate two-layer nanoscale/macroscale interfaces of the present invention, including mixed-scale integrated circuits, the predominantly microscale and submicroscale layer may implement various types of logic and functional units, and the predominantly nanoscale layer may serve primarily to interconnect the various submicroscale or microscale components and logic. By using nanoscale electronics for component and logic interconnection, the area and power consumption of a mixed-scale integrated circuit or other electronic device can both be significantly decreased.

Figure 4A:
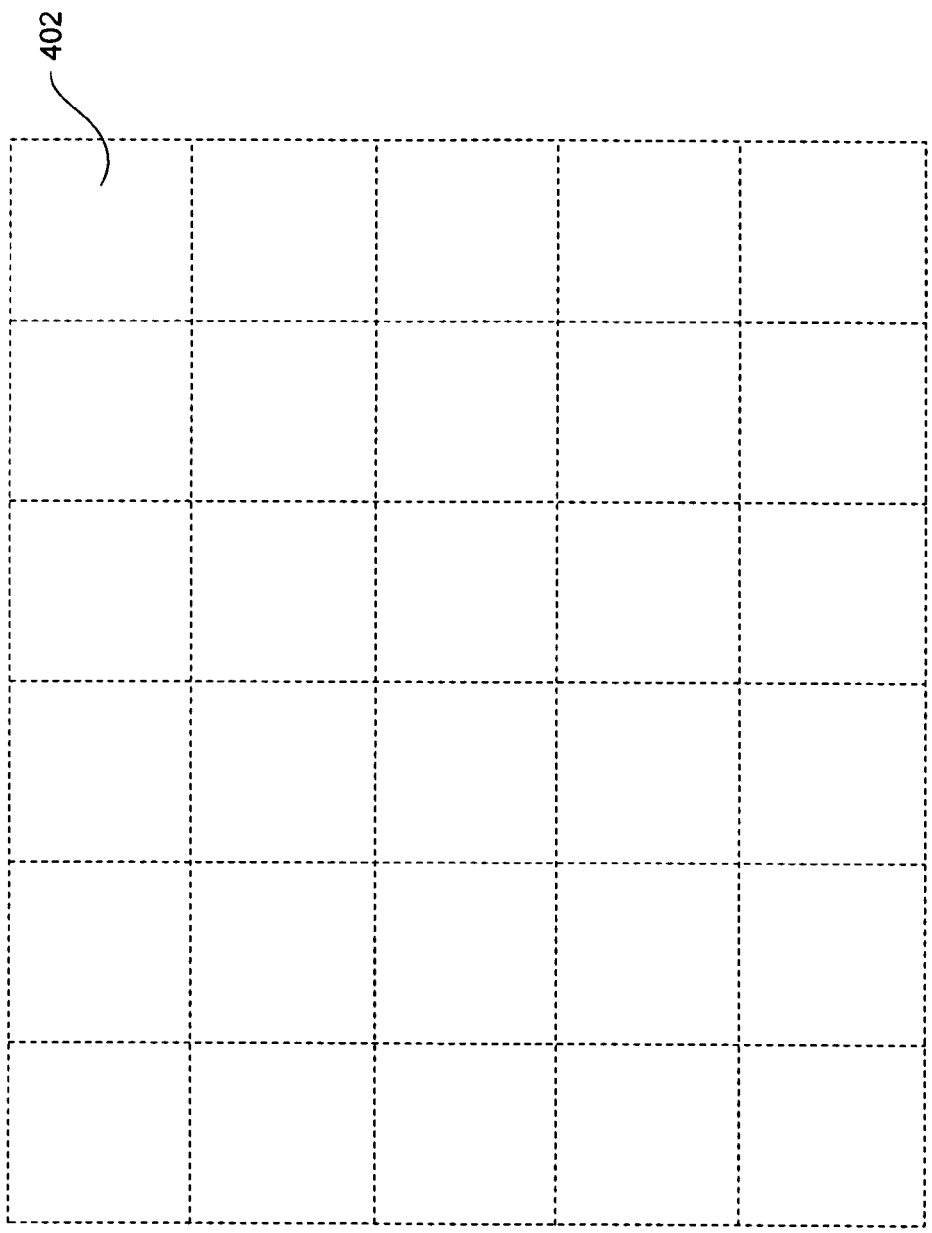

FIGS. 4A-D illustrate the overall organization and patterning of one class of two-layer nanoscale/macroscale-interface embodiments of the present invention. As shown in FIG. 4A, the predominantly submicroscale or microscale layer of the two-layer nanoscale/microscale interface can be considered to be organized into square or rectangular cells to form a rectilinear grid of microscale cells. FIG. 4A shows a tiny portion of the predominantly microscale layer of a two-layer nanoscale/macroscale interface that includes 30 microscale cells, such as microscale cell 402. The rectilinear organization of the predominantly microscale layer reflects only the arrangements of submicroscale or microscale pins within the predominantly microscale layer. The underlying submicroscale or microscale circuitry and components may not be so regularly patterned and may not otherwise conform to the rectilinear pattern illustrated in FIG. 4A. In general, each microscale cell contains a small number of submicroscale or microscale pins that are identically arranged and positioned in each microscale cell of the rectilinear grid. In subsequent figures, two-pin cells are illustrated. In various prototype designs of functional devices, four-pin microscale cells are employed. Because the pins are identically arranged in each microscale cell, the pins also form a regular pattern across the surface of the predominantly microscale layer.

FIG. 4B shows the organization of pad-interconnected-nanowire units ("PINUs") within a small portion of a first sub-layer of the predominantly nanoscale layer of a two-layer nanoscale/macroscale-interface embodiment of the present invention. The PINUs are arranged so that the centers of the pads of the PINUs fall on linear columns and rows. In FIG. 4B, a horizontal dashed line 402 is drawn through the centers of pads in one row, and a vertical dashed line 404 is drawn through the centers of a column of pads. The PINUs, including both the pad-portion and nanowire-portions of each PINU, are rotated by a small angle $\theta$ (406 in FIG. 4B) with respect to the row direction. Rotation of the PINUs allows nanowires of the PINUs to form closely spaced nanowire bundles, such as closely spaced nanowire bundle 408 in FIG. 4B, oriented at the small angle $\theta$ with respect to the row direction. In the described embodiments of the two-layer nanoscale/macroscale interface, the rows and columns that define the center of the PINUs form a rectilinear grid with square cells, although, in alternative embodiments, the columns need not be perpendicular to the rows, and the cells may be rhomboid. In the described embodiments of the present invention, the centers of the pads of the first nanoscale sub-layer are positioned to directly overlie the centers of approximately one-half of the pins in the predominantly microscale layer of the two-layer nanoscale/microscale interface, with the remaining pins centered within each square nanoscale cell of the first nanoscale sub-layer.

Figure 4C:
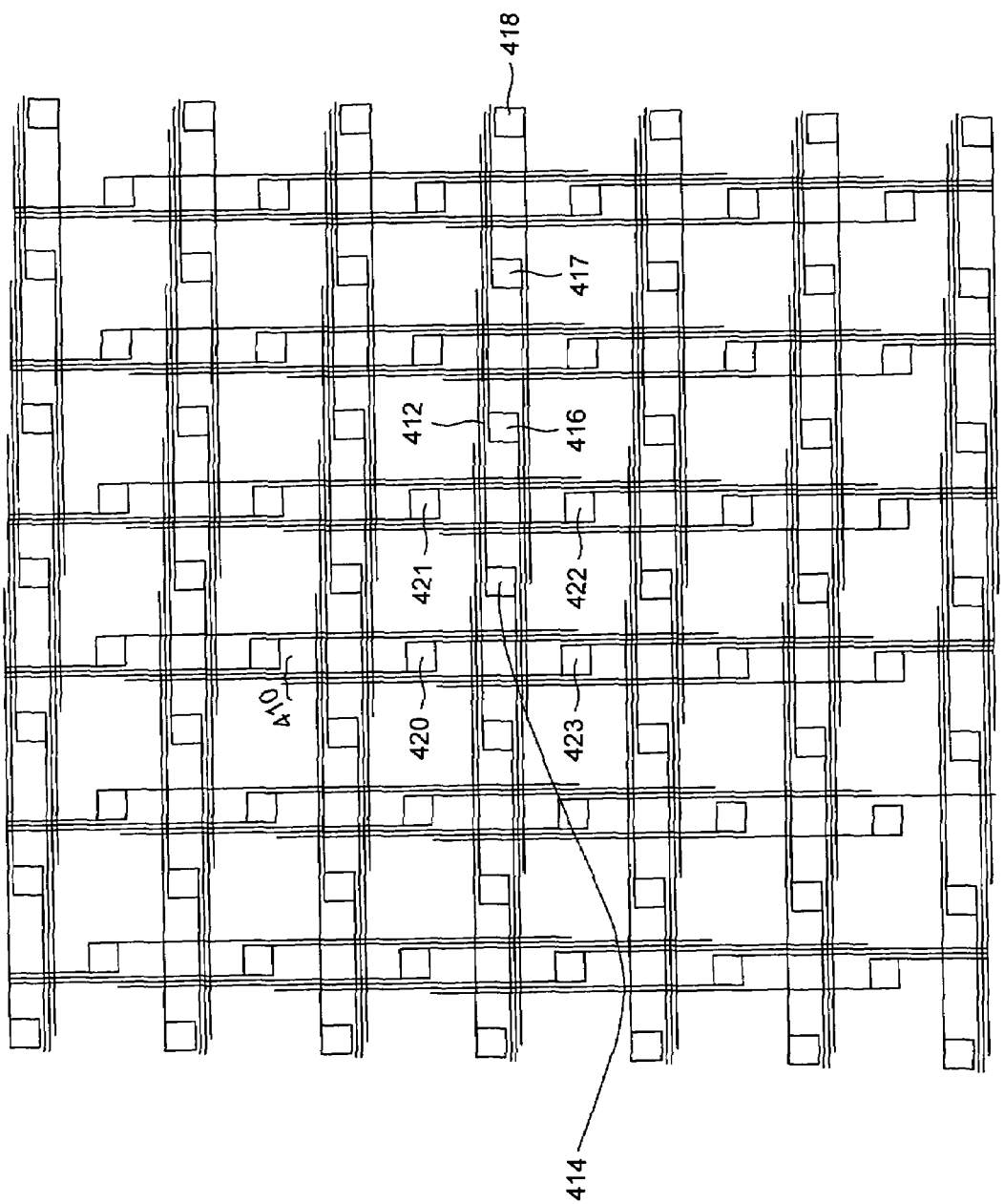

FIG. 4C shows a second nanoscale sub-layer overlaying the first nanoscale sub-layer shown in FIG. 4B to form a small portion of the tessellated, predominately nanoscale layer of a two-layer nanoscale/macroscale-interface embodiment of the present invention. In the described embodiments of the present invention, the second nanoscale sub-layer is identical in organization to the first nanoscale sub-layer, but is rotated 90 degrees with respect to the first nanoscale sub-layer and translated, by $1/\sqrt{2}$ times the pad-repeat distance along columns and rows of the first nanoscale sub-layer, in a diagonal direction, so that the pads of the second nanoscale sub-layer are located at the centers of the cells formed by the pads of the first nanoscale sub-layer and so that each second-sub-layer pad is, in the case of square cells, equidistant from the nearest surrounding pads of the first nanoscale sub-layer. In this organization, the nanowires of the second nanoscale sub-layer form parallel, closely spaced bundles, such as parallel, closely spaced bundle 410, perpendicular to the parallel, closely spaced bundles of nanowires of the first nanoscale sub-layer. In the predominantly nanoscale layer shown in FIG. 4C, each of the two nanowires of each PINU has a length equal to approximately three times the repeat distance of pads in the column and row directions of the nanoscale sub-layer that contains the PINU. For example, nanowire 412 emanating from pad 414 of the second nanoscale sub-layer spans pads 416-418 of the first nanoscale sub-layer, which have pad-repeat distances equal to those in the second nanoscale sub-layer. In alternative embodiments, the nanowires may have much greater lengths with respect to the pad repeat distance, as long as a nanowire in one layer is not positioned so closely to a pin or pad in the other layer that there is an undesired electrical interaction between the two. The longer the nanowires, the more nanowires that may be present in each parallel, closely spaced bundle of nanowires. Pad 414 is representative of the vast majority of pads within a large, predominantly nanoscale layer of the illustrated two-layer nanoscale/microscale interface, and is surrounded by two vertical and two horizontal channels, each comprising parallel, closely spaced bundles having a three-nanowire width, which separate pad 414 from its four nearest neighbor pads 420-423 in the first nanoscale sub-layer.

Figure 4D:
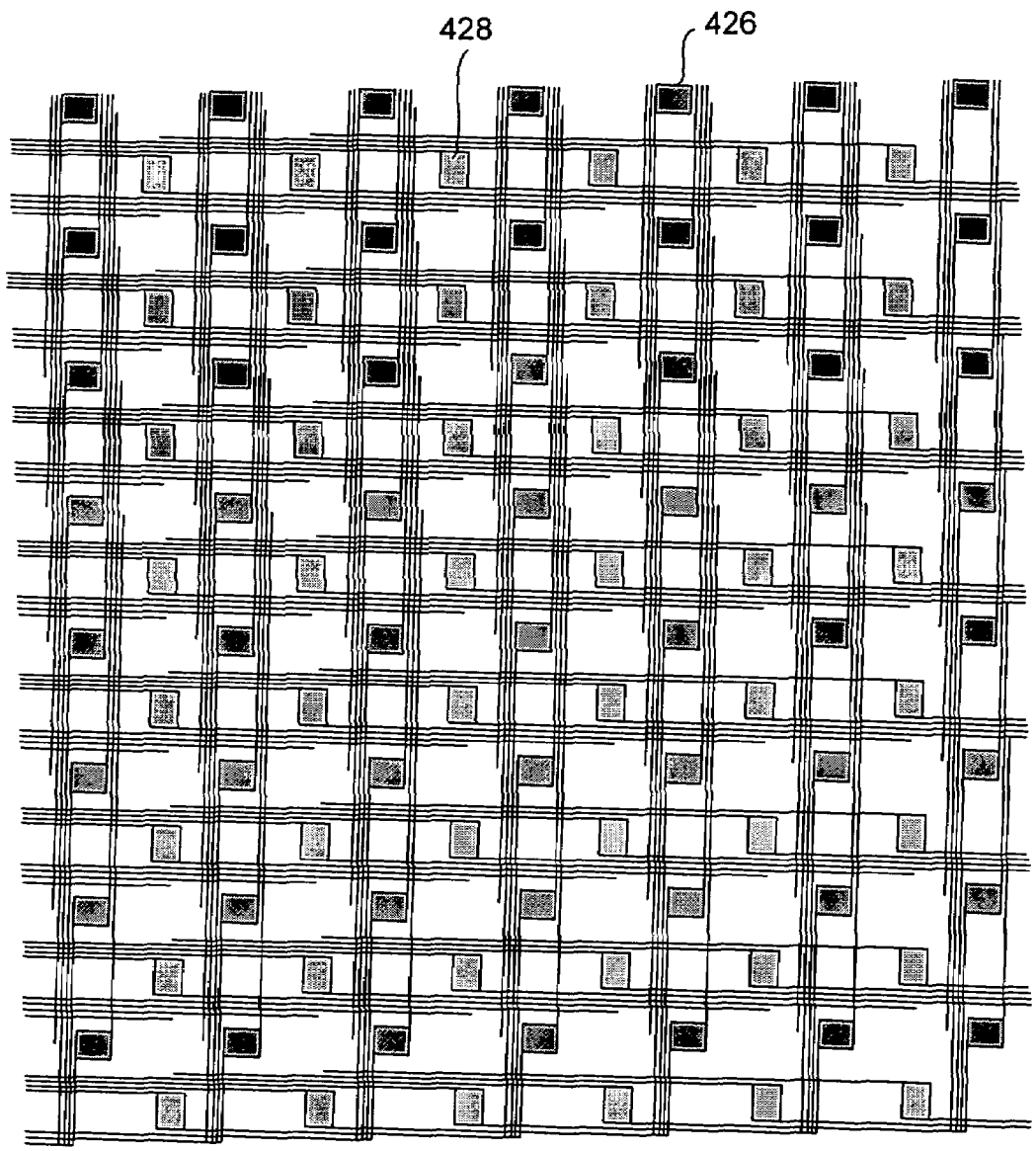

FIG. 4D illustrates, in a fashion similar to FIGS. 4B and 4C, a tessellated, predominantly nanoscale layer of a two-layer nanoscale/microscale-interface embodiment of the present invention in which each of the two nanowires of each PINU have a length equal to approximately four times the repeat distance of the pads within the nanoscale sub-layer that contains the PINU. While, in FIG. 4C, the parallel, closely spaced bundles of nanowires each includes, at each point, three separate nanowires, in the parallel, closely spaced bundles of nanowires in FIG. 4D each includes, at each point, up to four nanowires. Each channel is actually composed of many different nanowires, since channels span the entire, or a large portion of the, predominantly nanoscale layer, while individual nanowires are generally much shorter. Thus, the length of the nanowires of each PINU determine the width, in nanowires, of the parallel, closely spaced bundles of nanowires, or channels, within the tessellated, predominantly nanoscale layer. In FIG. 4D, the darkly colored pads, such as pad 426, lie in a first nanoscale sub-layer, and the lighter shaded pads, such as pad 428, lie in a second nanoscale sub-layer.

Figure 5:
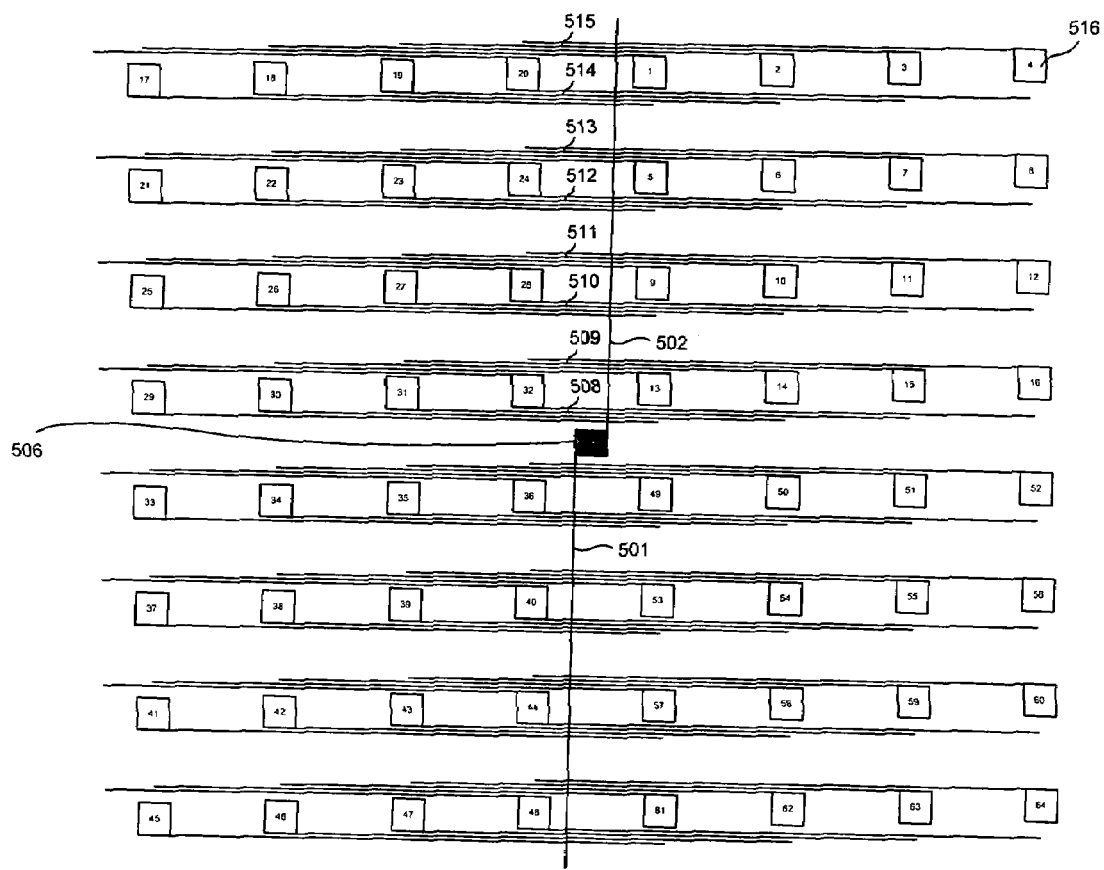
FIG. 5 illustrates the first-nanoscale-sub-layer pads electrically connected, through a single nanowire junction, to one particular second-nanoscale-sub-layer pad in the tessellated, predominantly nanoscale layer of a two-layer nanoscale/microscale interface-embodiment of the present invention shown in FIG. 4D.

FIG. 5 illustrates the first-nanoscale-sub-layer pads potentially electrically connected, through a single nanowire junction, to one particular second-nanoscale-sub-layer pad in the tessellated, predominantly nanoscale layer of a two-layer nanoscale/microscale interface-embodiment of the present invention shown in FIG. 4D. As discussed above, the nanowires 501 and 502 emanating from the particular second-nanoscale-sub-layer pad 506 each span four pad-repeat distances. Each of the two nanowires 501 and 502 therefore cross over, and form nanowire junctions, with the four nanowires in eight different channels. For example, nanowire 502 forms nanowire junctions with each of the four nanowires in channels 508-515. Each nanowire junction potentially connects, depending on the nature of the nanowire junction, the nanowire with a first-nanoscale-layer PINU. The particular second-nanoscale-sub-layer pad 506 may be electrically interconnected with the 64 first-nanoscale-level pads, such as first-nanoscale-sub-layer pad 516, shown in FIG. 5, and numbered 1-64. A single pin of the predominantly microscale or submicroscale layer of the two-layer nanoscale/microscale interface may therefore be connected, in the embodiment illustrated in FIG. 4D, to each of up to 64 neighboring pins by two PINUs and a single intervening nanowire junction. When the length of the nanowires increases, the number of nanowires in each channel increases, the number of channels spanned by a PINU increases, and the number of pads or pins interconnected through a single nanowire junction geometrically increases. For example, in a nanoscale layer of a nanoscale/microscale-interface embodiment of the present invention in which each nanowire of a PINU spans ten pad-repeat distances, a given pad or pin may be electrically interconnected, through single nanowire junctions, with up to 400 neighboring pins or pads.

Figure 6:
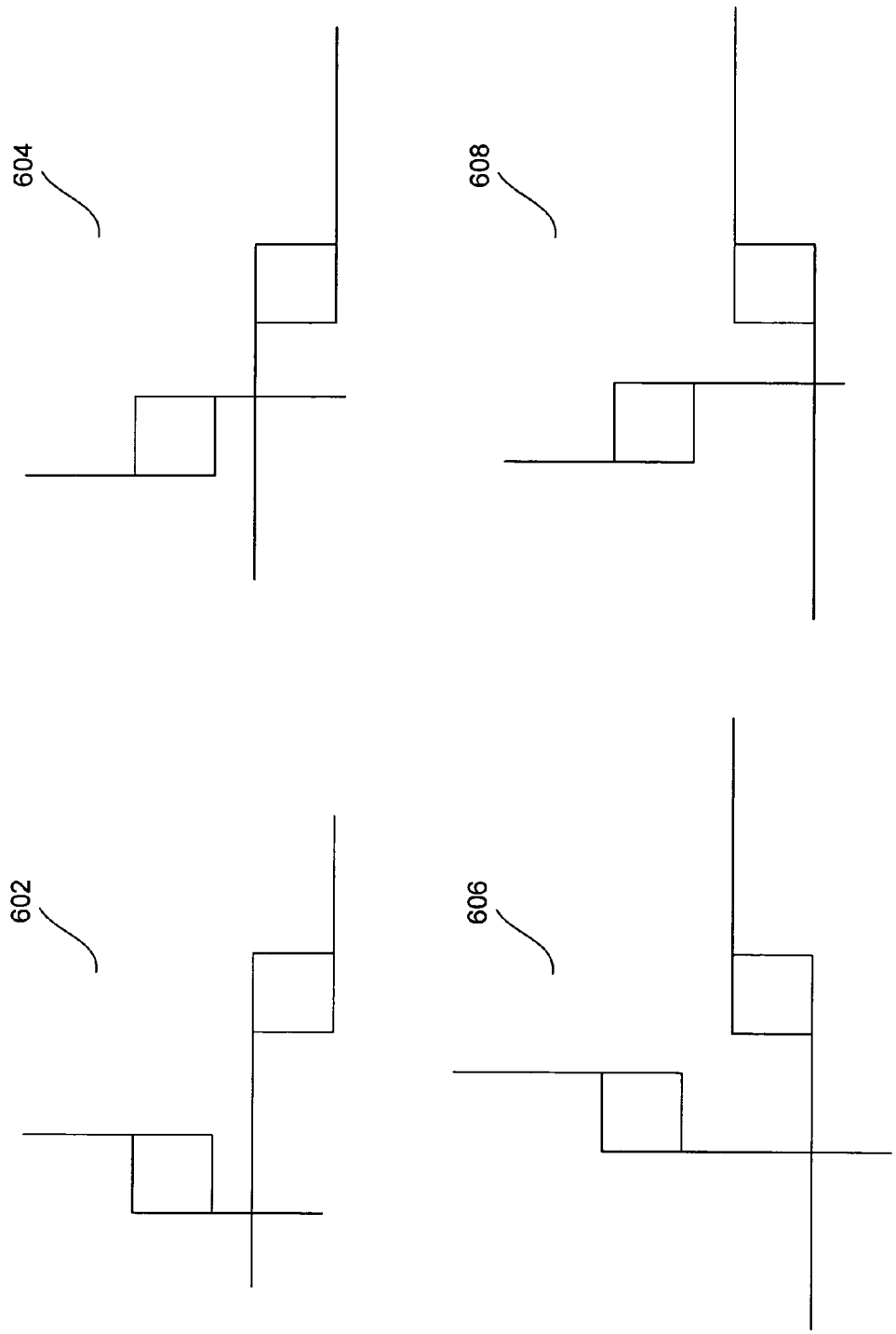
FIG. 6 illustrates four symmetry-related arrangements of a first-nanoscale-sub-layer pad with a second-nanoscale-sub-layer pad within a tessellated, predominantly nanoscale layer of a two-layer nanoscale/microscale-interface embodiment of the present invention.

There are an almost limitless number of different configurations of a tessellated, predominantly nanoscale layer that may be used in a two-layer nanoscale/microscale interface according to the present invention. As discussed above, pad-repeat distances may vary, angles between rows and columns of pads may depart from 90°, and pad-cornered cells of the tessellated, predominantly nanoscale layer may be, in addition to squares and rectangles, diamond shaped or rhomboid in nature. Furthermore, for any given arrangement of PINUs, there are a number of other symmetry-related arrangements with equivalent pad spacings and column and row orientations. FIG. 6 illustrates four symmetry-related arrangements 602, 604, 606, and 608 of a first-nanoscale-sub-layer pad and a second-nanoscale-sub-layer pad within a tessellated, predominantly nanoscale layer of a two-layer nanoscale/microscale-interface embodiment of the present invention. In three-dimensional networks of PINUs and other features and components within multiple nanoscale sub-layers, a much larger number of symmetry related arrangements for any given arrangement may be possible.

Figure 7A:
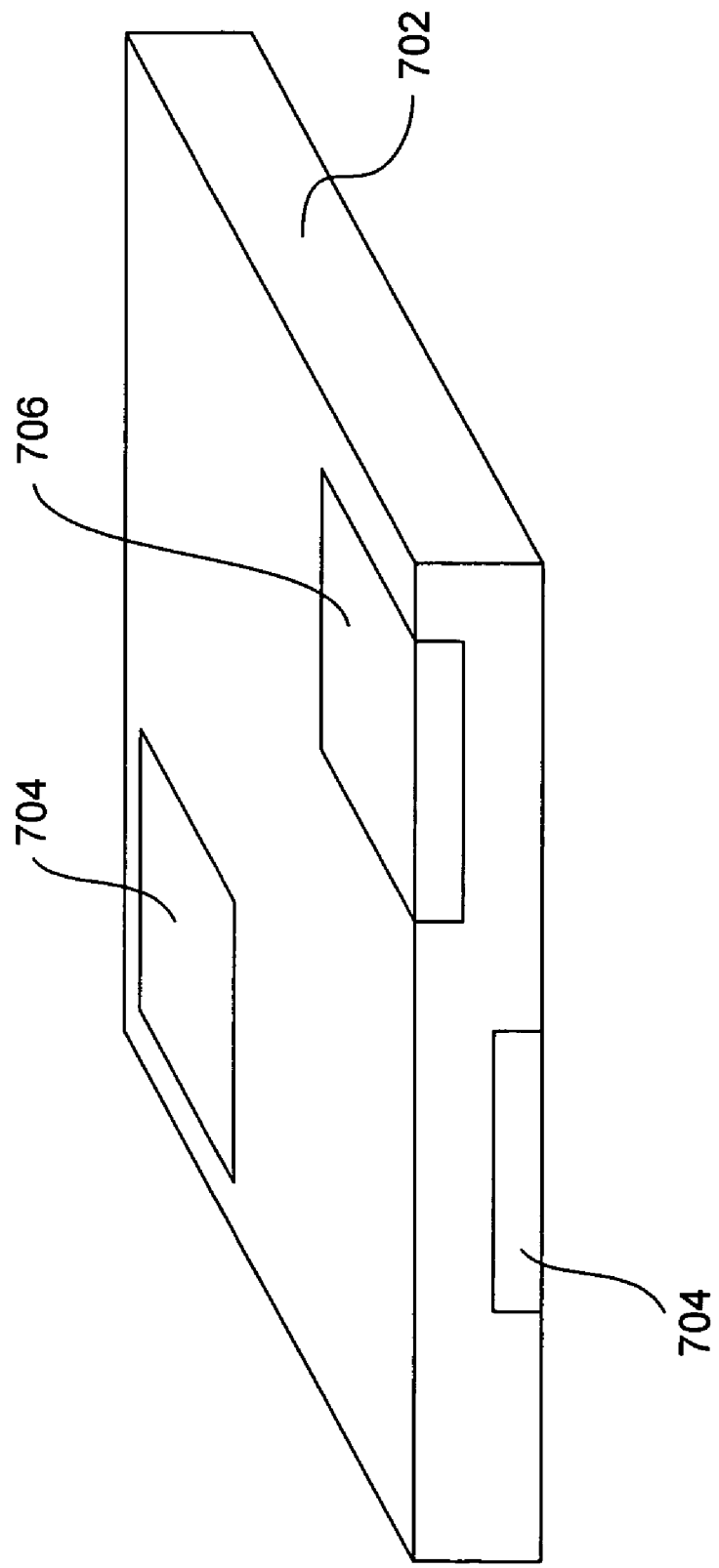
FIGS. 7A-T illustrate one method for fabricating a two-layer nanoscale/microscale-interface embodiment of the present invention, the method constituting an additional embodiment of the present invention.
Figure 7B:
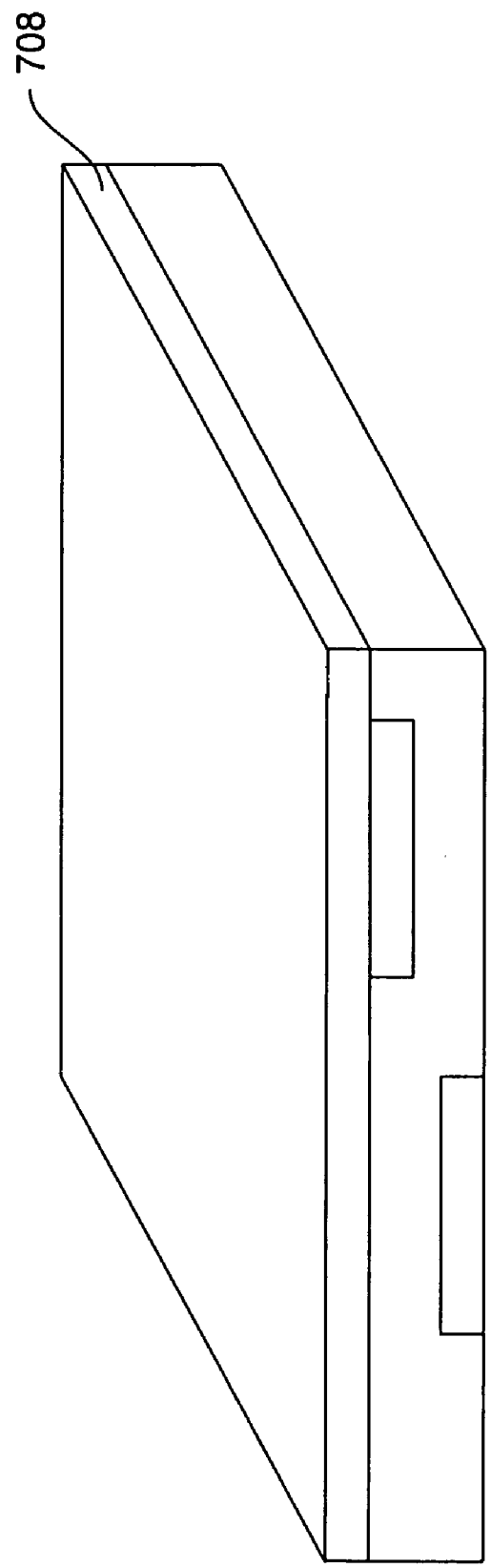
Figure 7C:
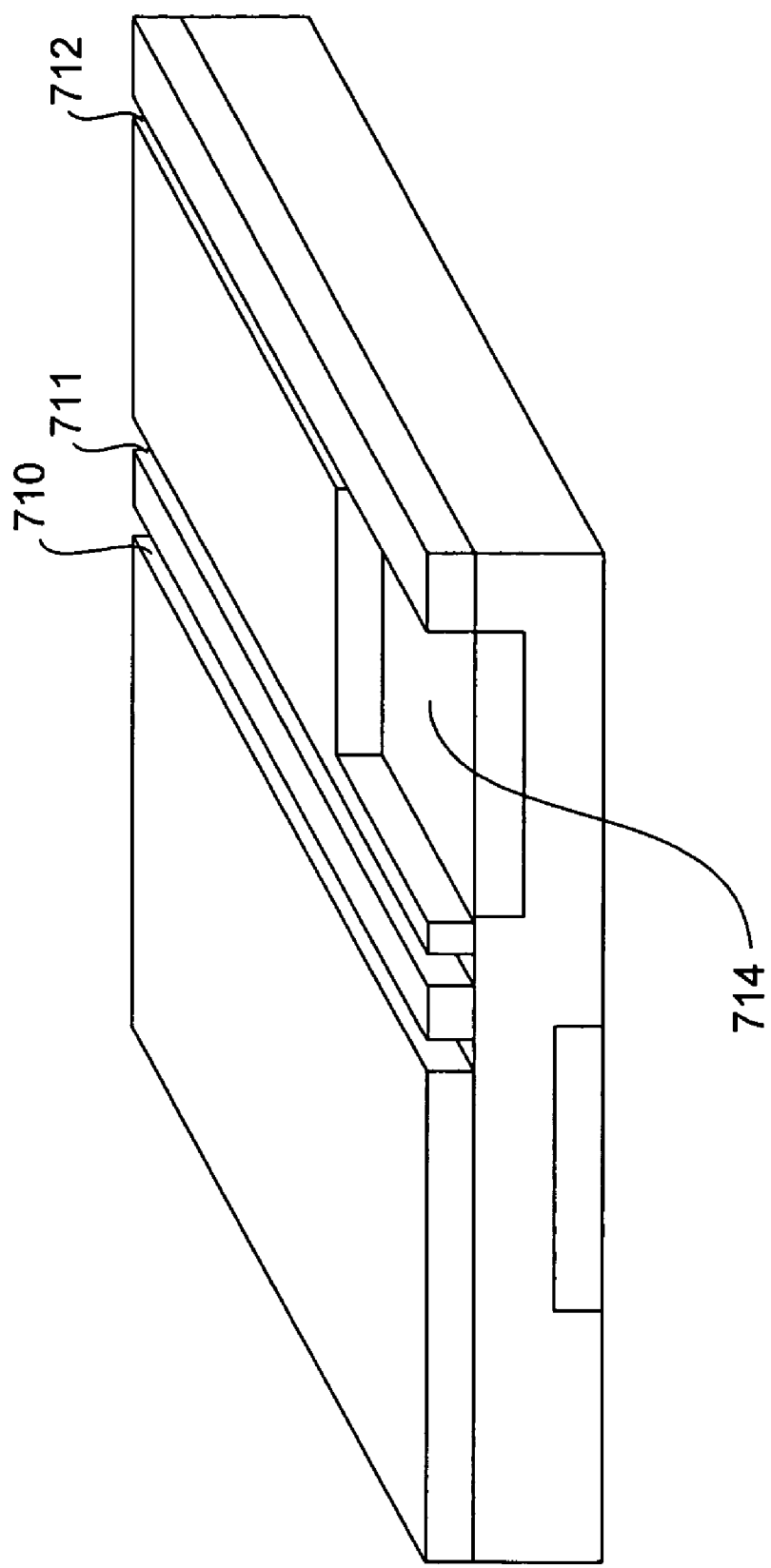
Figure 7D:
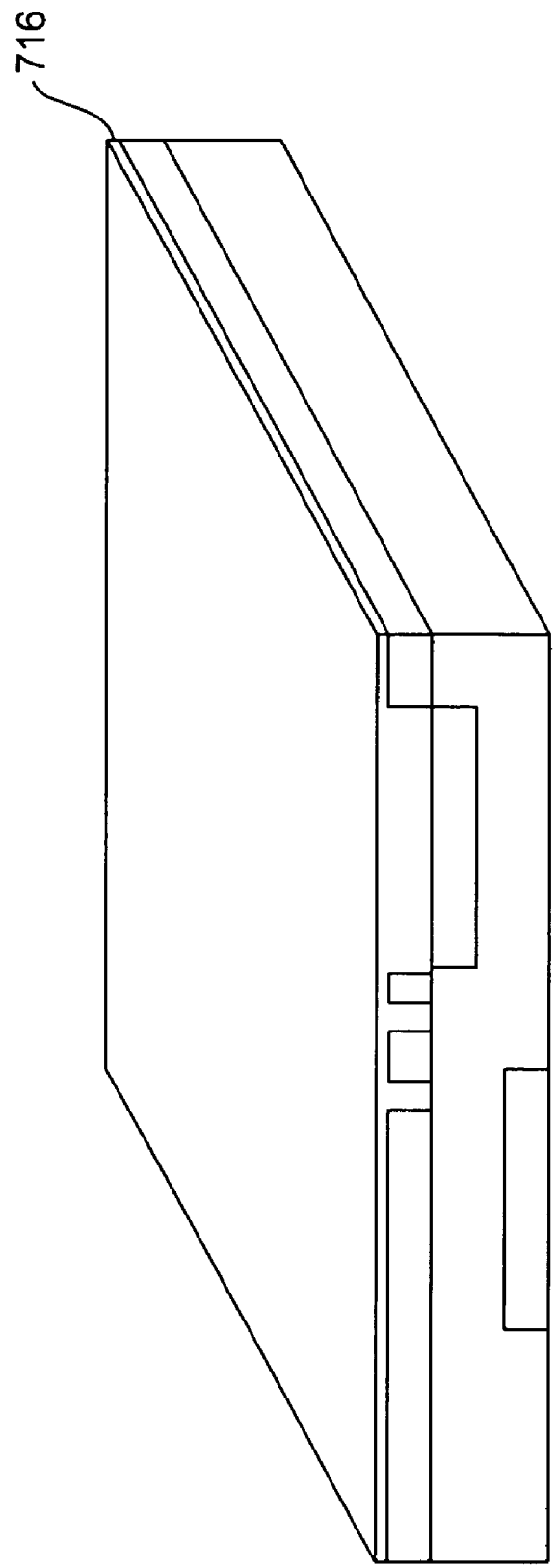
Figure 7E:
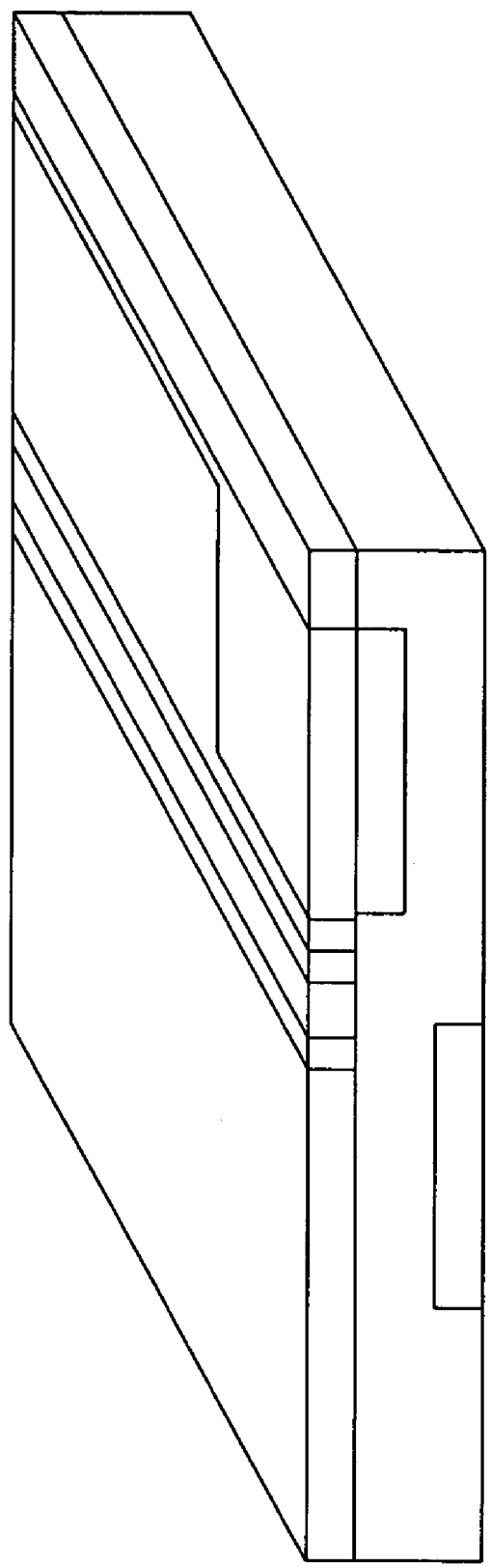
Figure 7F:
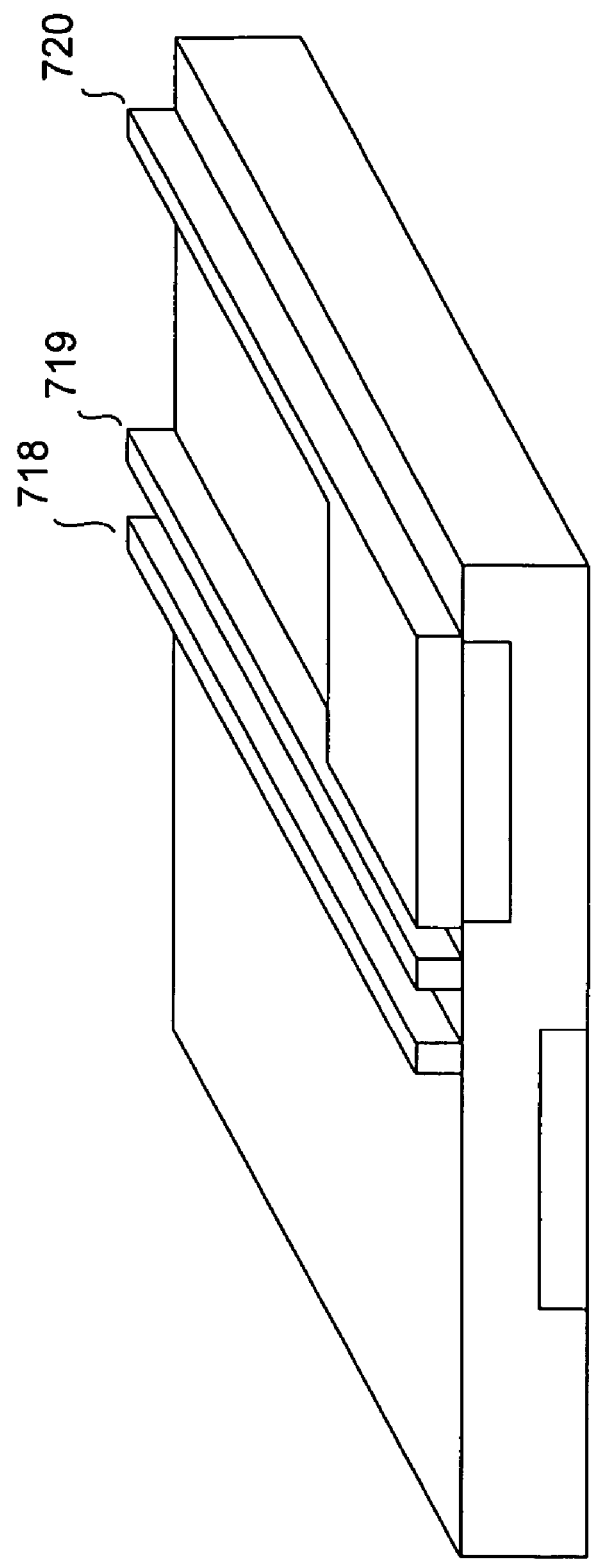
Figure 7G:
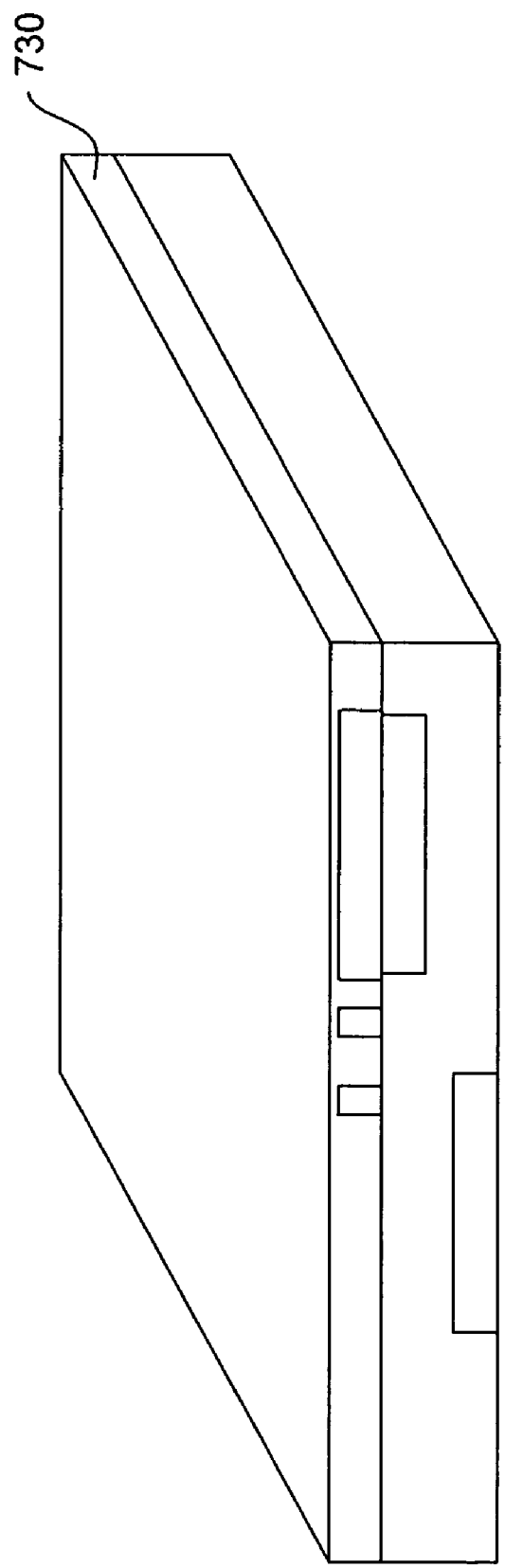
Figure 7H:
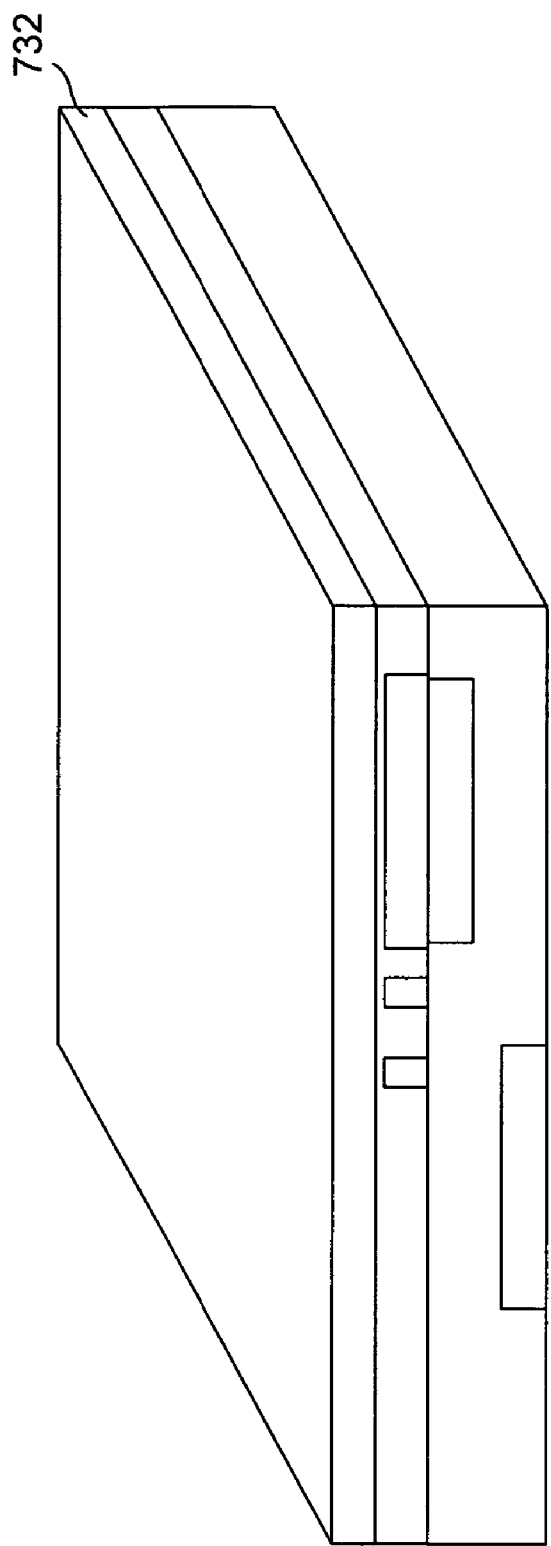
Figure 71:
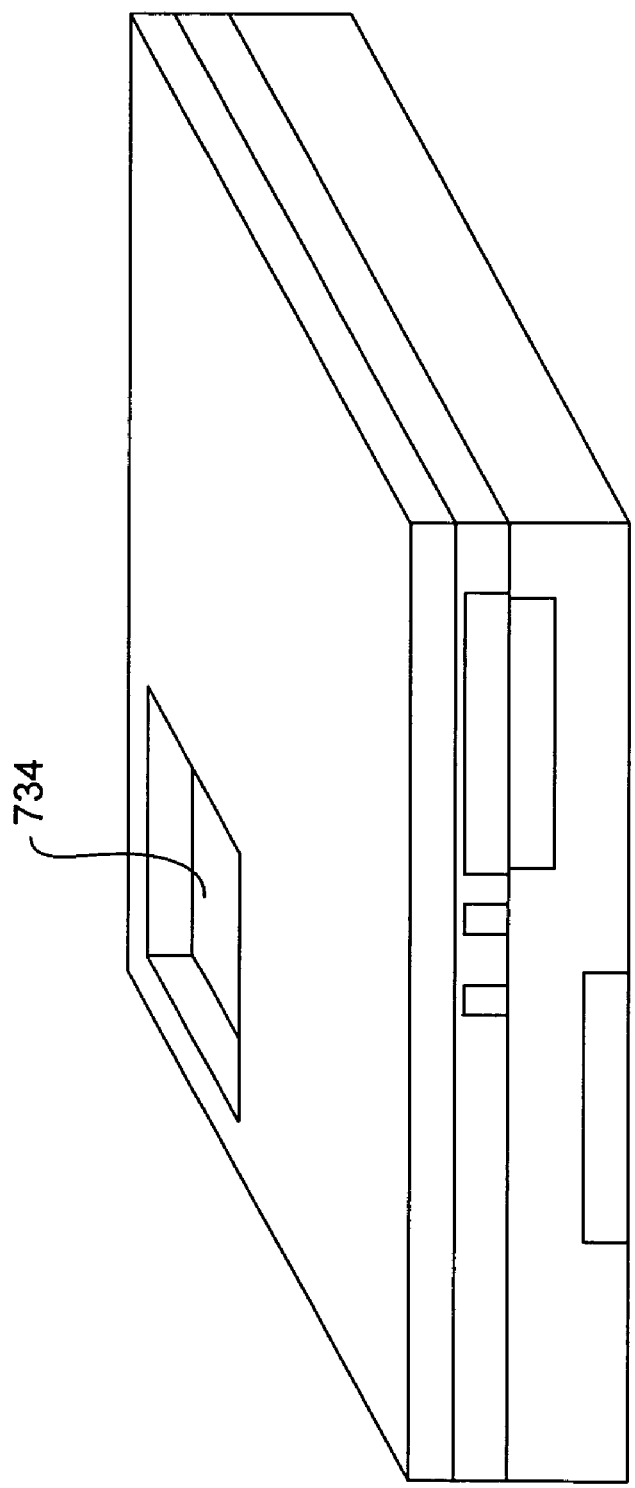
Figure 7J:
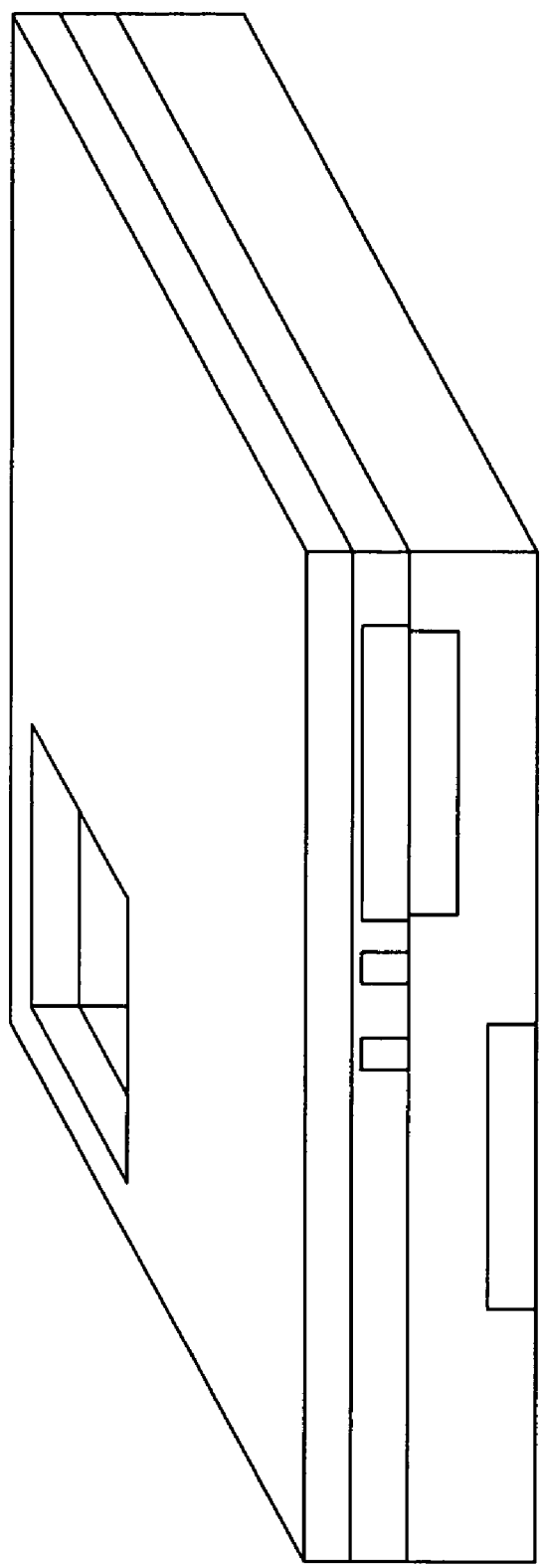
Figure 7K:
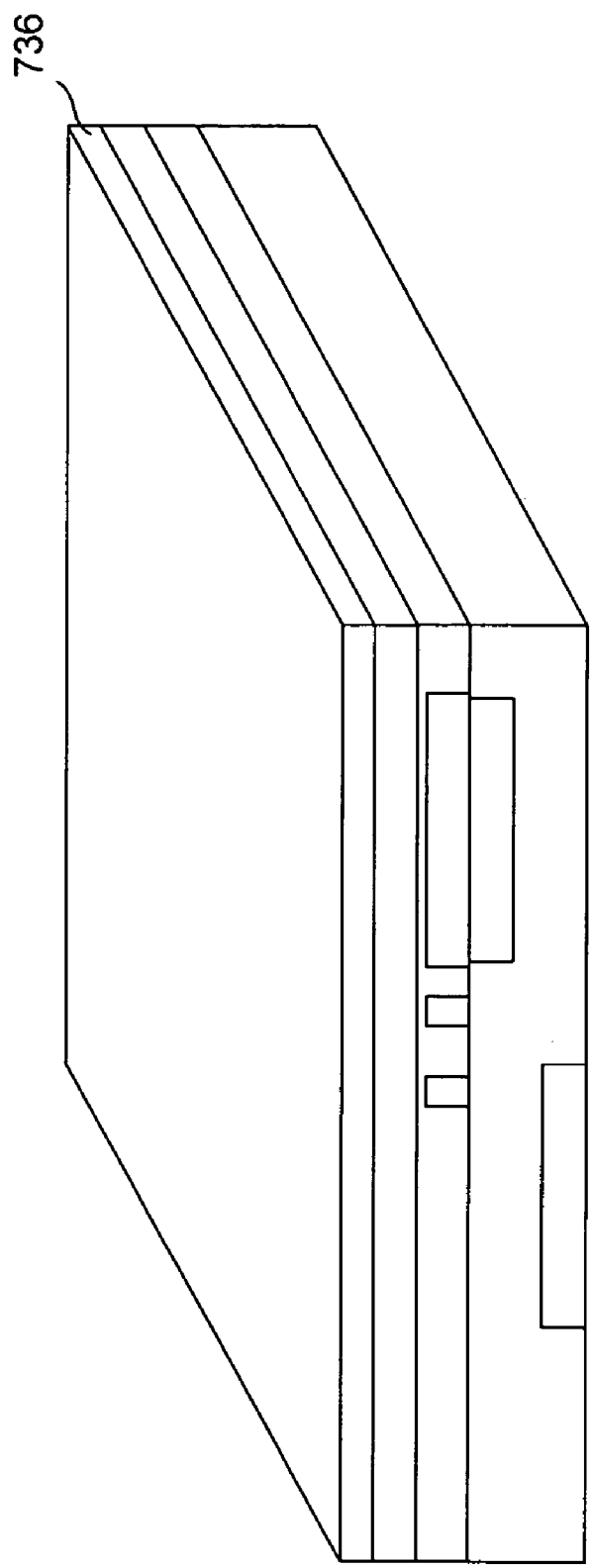
Figure 7L:
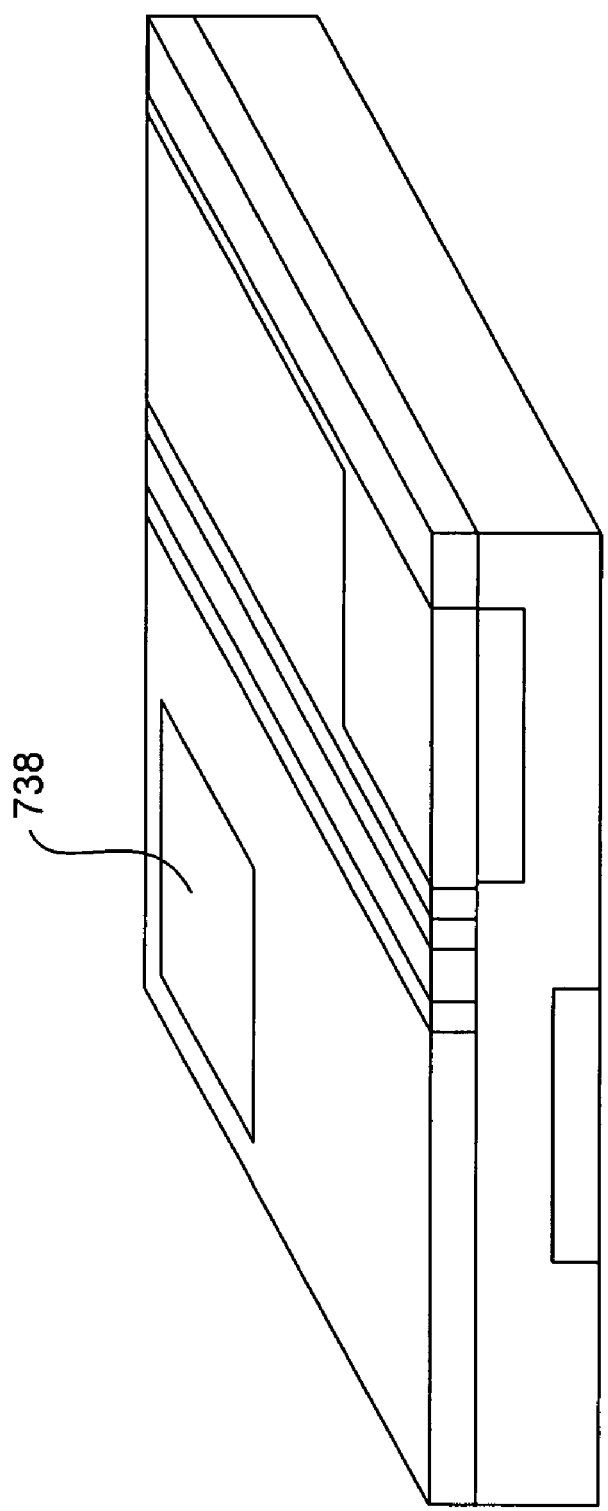
Figure 7M:
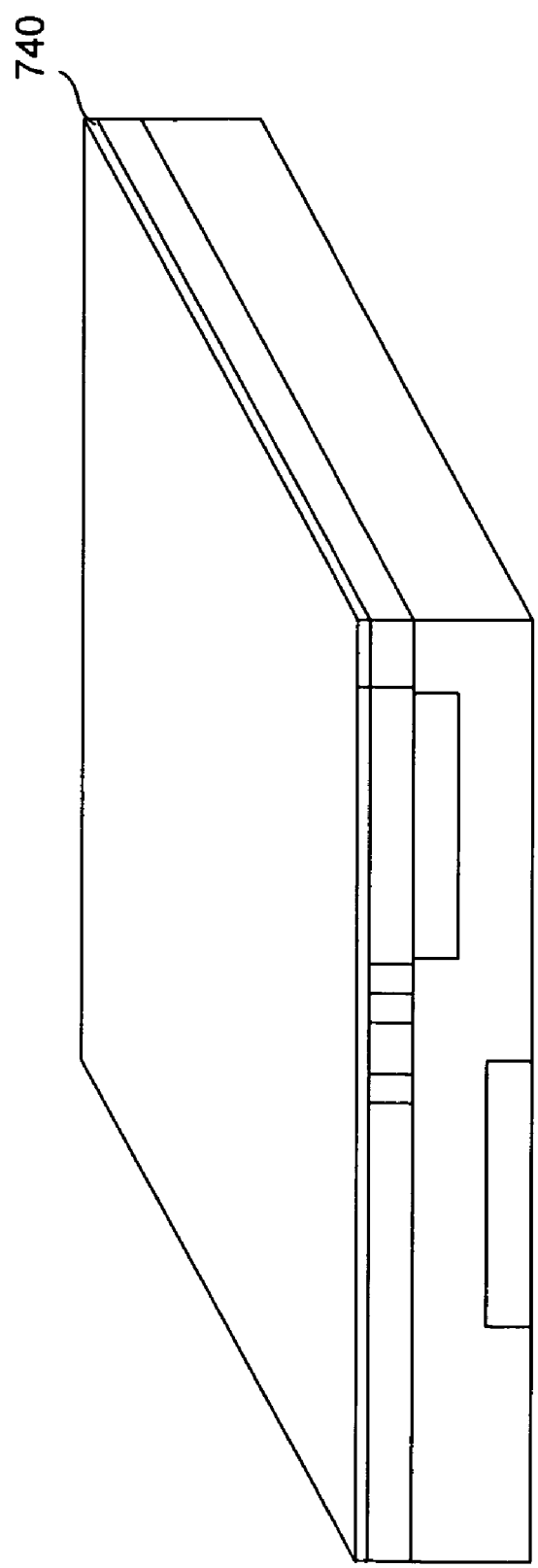
Figure 7N:
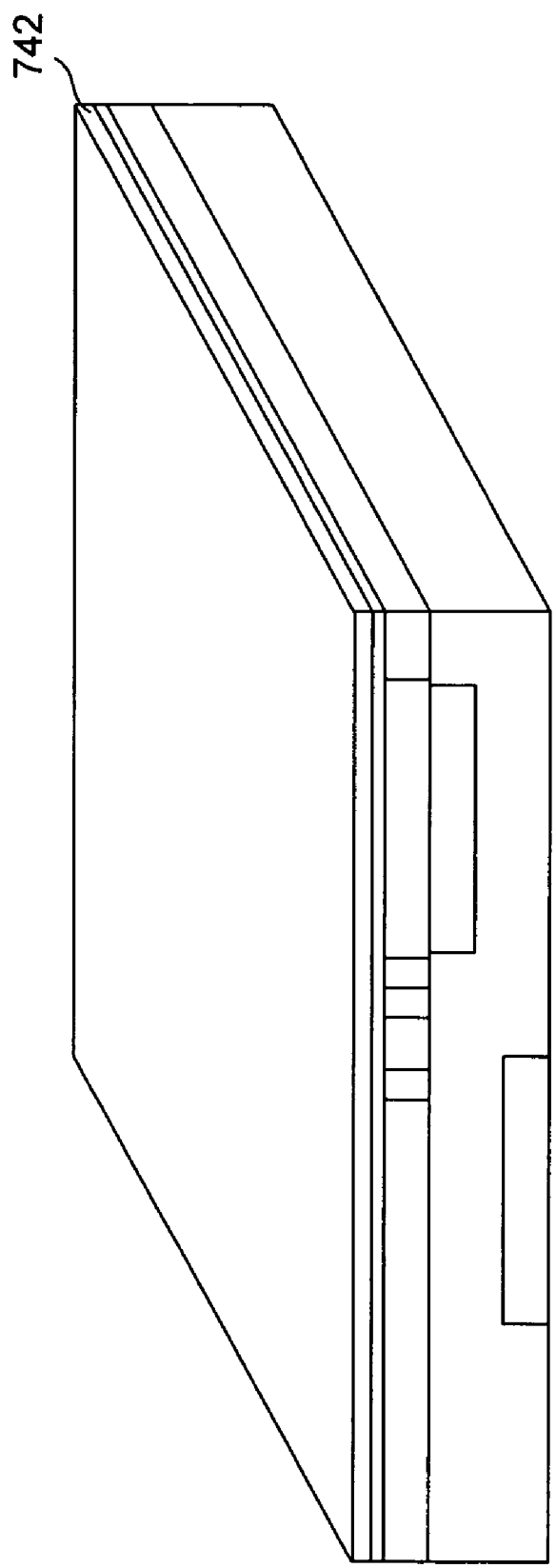
Figure 70:
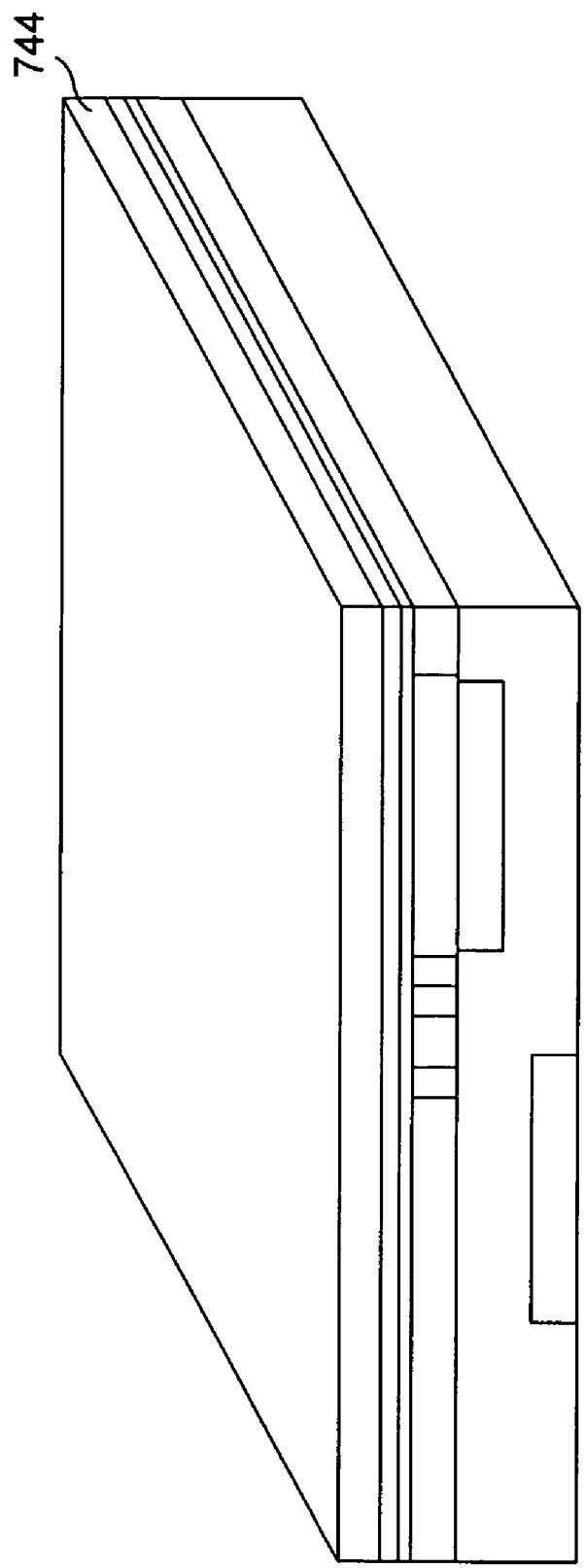
Figure 7P:
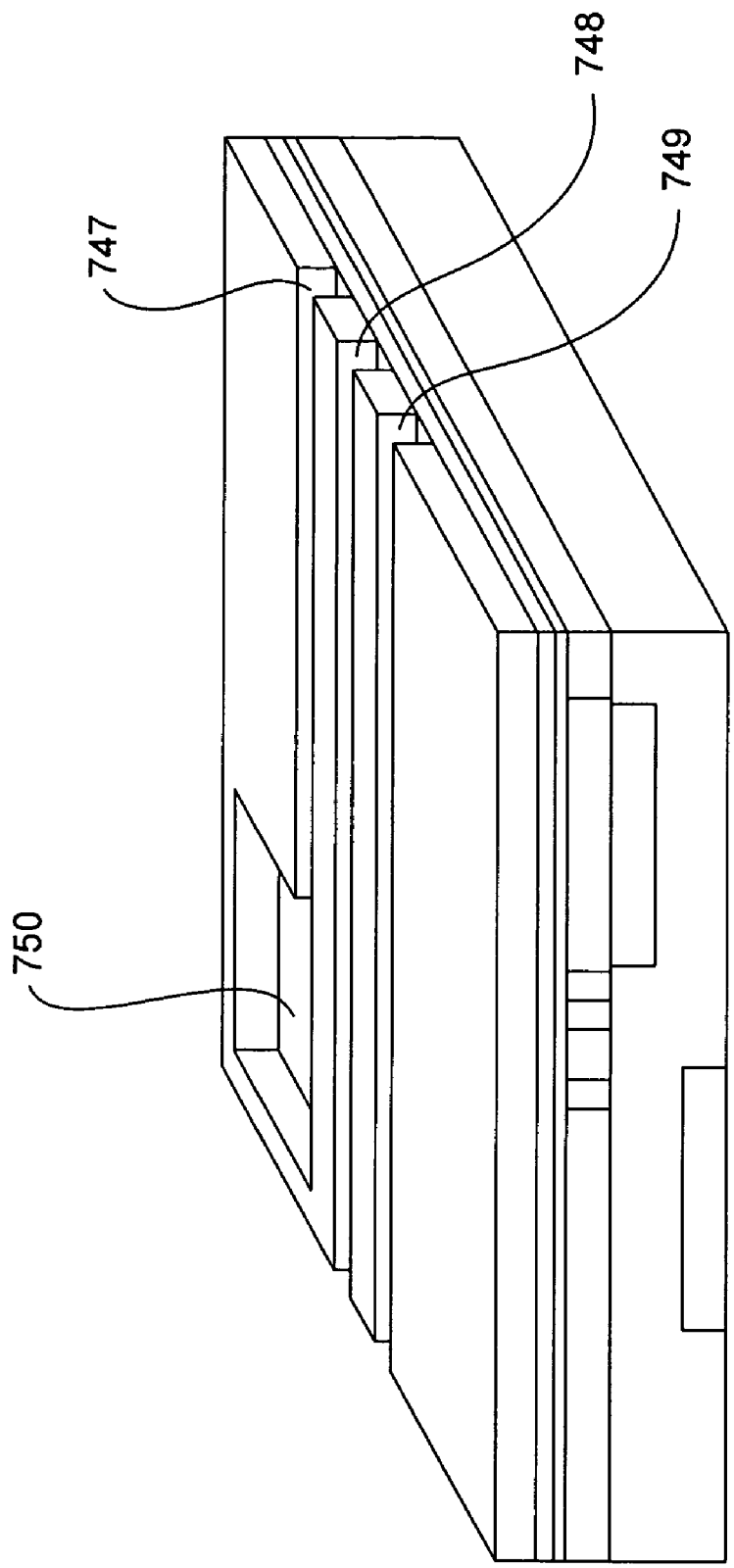
Figure 7Q:
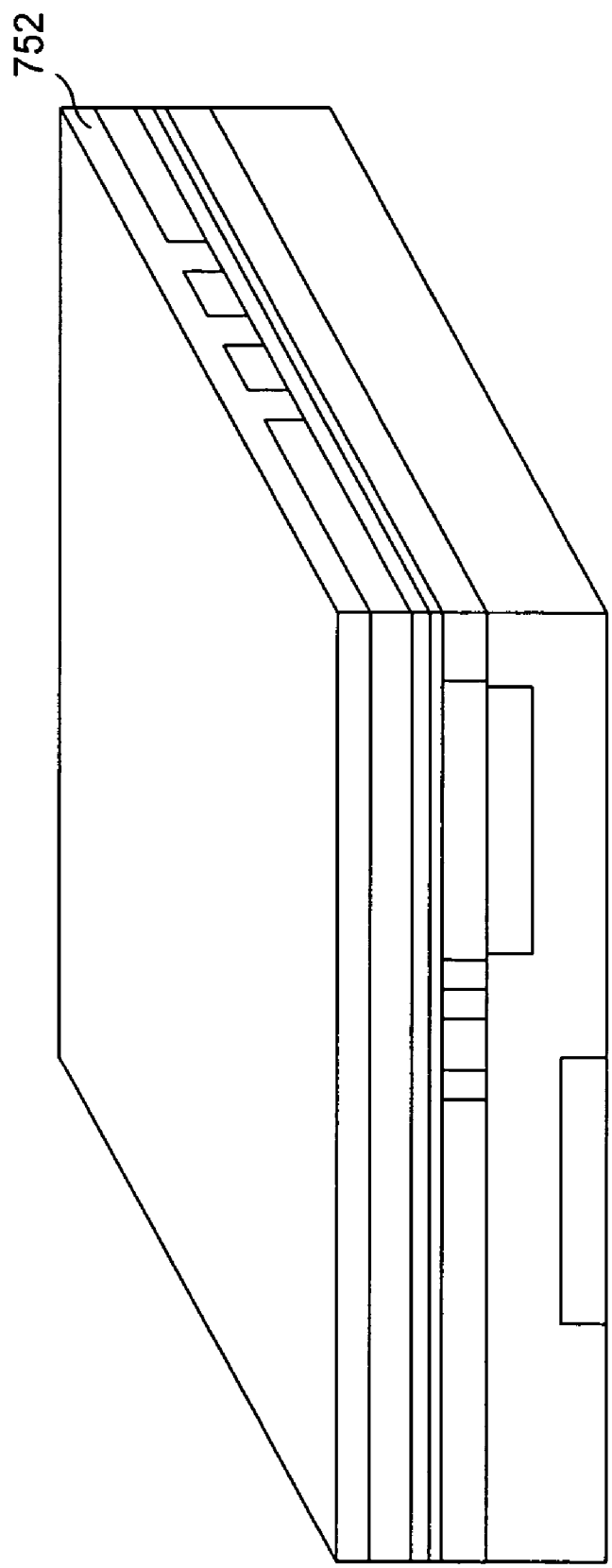
Figure 7R:
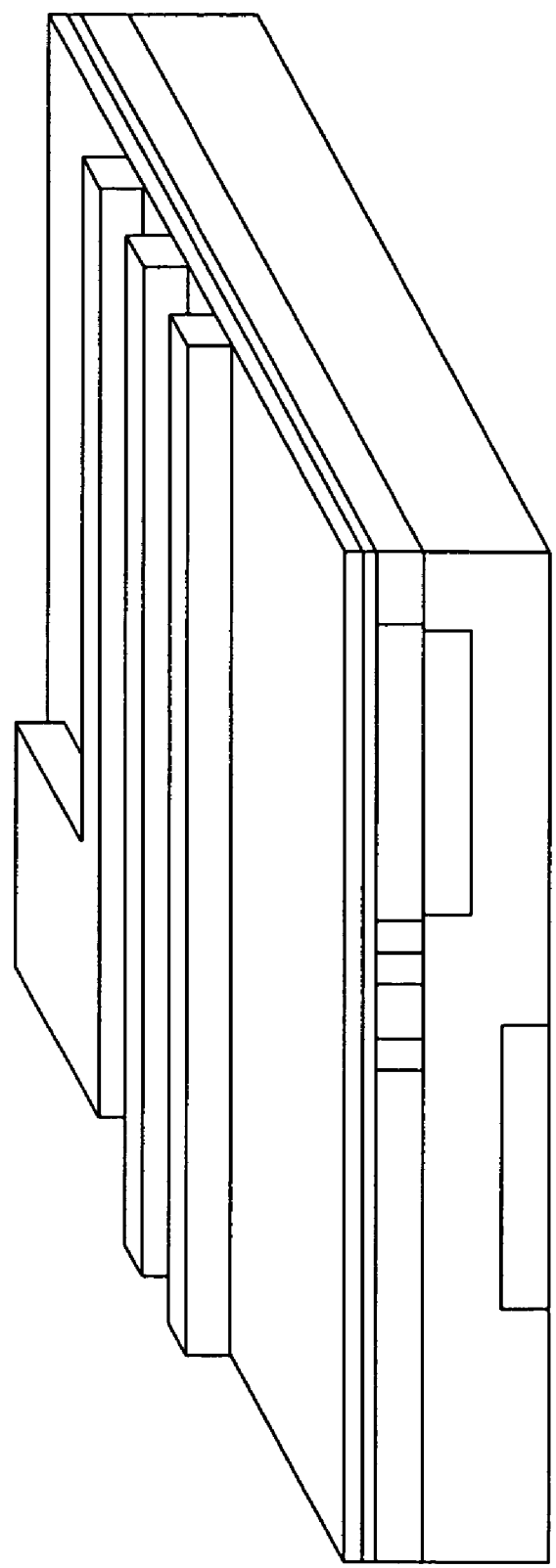
Figure 7S:
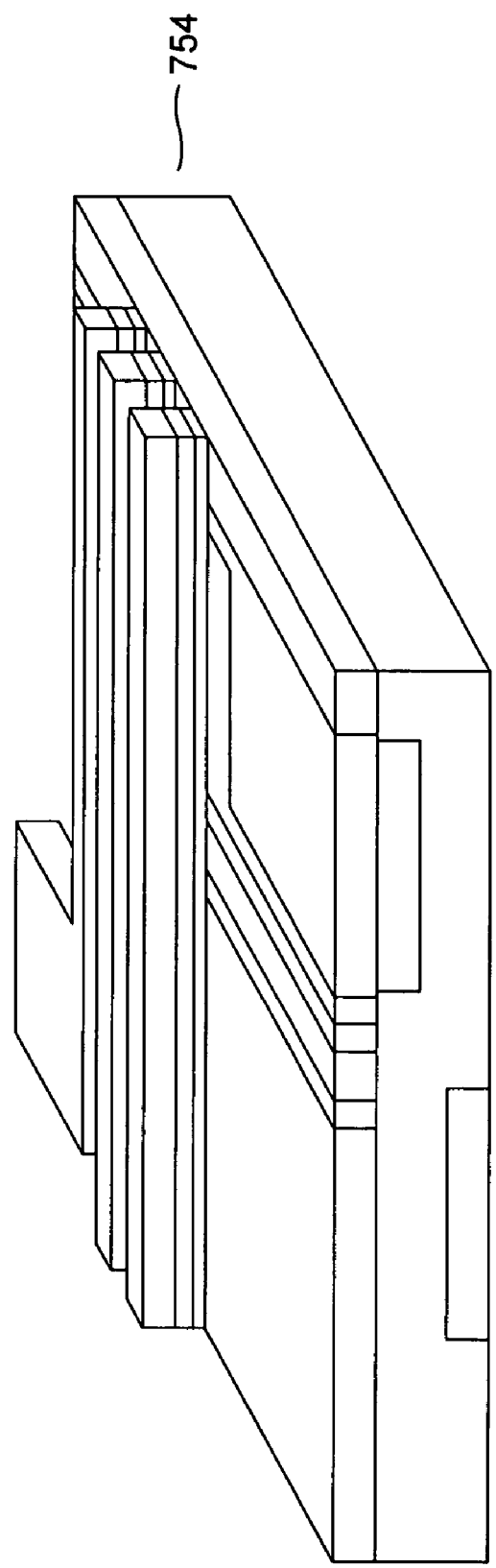
Figure 7T:
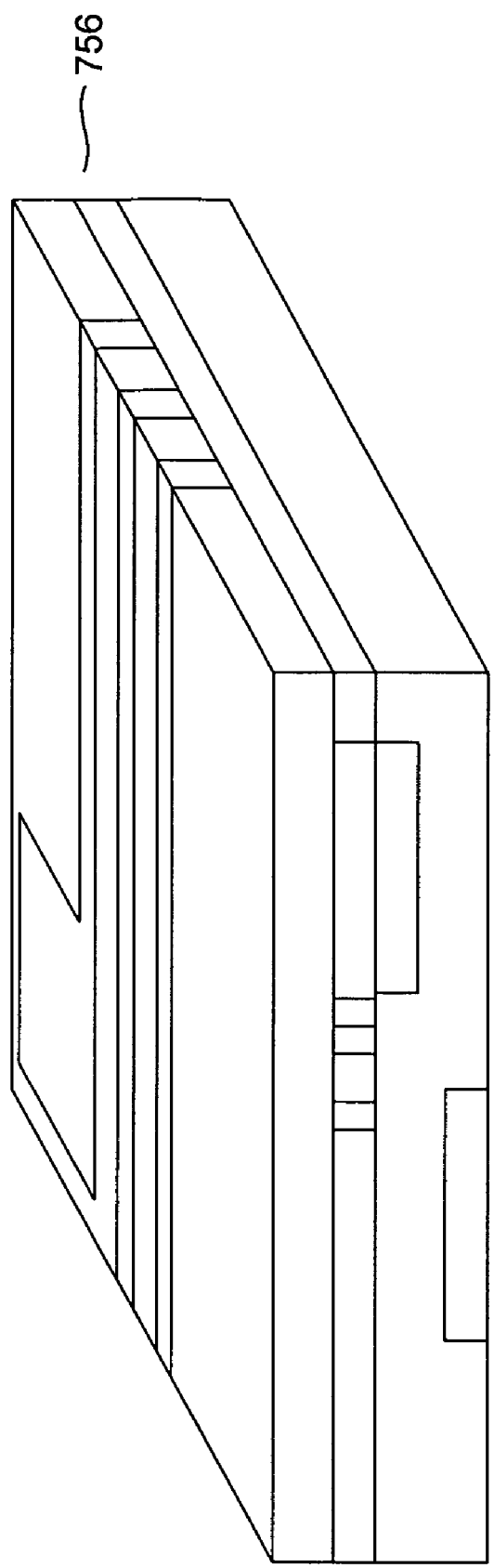

FIGS. 7A-T illustrate one method for fabricating a two-layer nanoscale/microscale-interface embodiment of the present invention, the method constituting an additional embodiment of the present invention. As shown in FIG. 7A, the process begins with a substrate consisting of, or including, a predominantly microscale layer 702 with a regular arrangement of microscale or submicroscale pins 704 and 706 at the surface of the substrate. The pins may be composed of a variety of conductive materials, including conductive polymers, metal elements or alloys, or conductive and doped silicon or gallium arsenide, and may be embedded in a variety of different substrate materials, including silicon dioxide. The predominantly microscale layer 702 includes further submicroscale or microscale components, signal lines, and other features 704 that implement various functional components and logic elements of an electronic device. The predominantly microscale layer is fabricated using conventional photolithographic methods.

Next, as shown in FIG. 7B, a layer of nanoimprint resist 708, such as solvated poly-methyl-methacrylate ("PMMA") or poly-benzyl-methacrylate ("PBMA") dissolved in benzyl-methacrylate, is deposited above the predominantly microscale layer. Then, as shown in FIG. 7C, the nanoimprint resist may be cured and then imprinted by a nanoimprinting technique to form troughs 710-712 and basins 714 corresponding to first-nanoscale-sub-layer nanowires and pads, respectively. Nanoimprinting techniques generally employ nanoimprinting stamps prepared from masters fabricated by painstaking, electron-beam-based techniques. The nanoimprinted nascent nanoscale/microscale interface may be briefly exposed to a nanoimprint-resist etchant to remove nanoimprint resist from the floors of the nanoimprinted troughs and basins.

Next, as shown in FIG. 7D, a conductive layer 716 is deposited above the nanoimprint resist to form first-nanoscale-sub-layer PINUs. In one embodiment of the present invention, platinum is used for PINUs. Unwanted portions of the deposited, conductive layer and underlying nanoimprint resist may be subsequently removed by a lift-off process to produce well-formed, conductive PINUs, as shown in FIG. 7F. Alternatively, a two-step process may be used to first remove unwanted conductive material, as shown in FIG. 7E, and to then remove nanoimprint resist. Any remaining nanoimprint resist may be removed by exposing the nascent two-layer nanoscale/microscale interface to a nanoimprint-resist etchant. At this point, the first-nanoscale-sub-layer PINUs 718-720 are fully fabricated.

Next as shown in FIG. 7G, a layer 730 of a dielectric material with a low dielectric constant k, such as $SiO_2$, is deposited over the first-nanoscale-sub-layer. This dielectric layer may be polished by a chemical/mechanical polishing step. Then, as shown in FIG. 7H, a nanoimprint resist layer 732 is applied. Then, as shown in FIG. 7I, basins 734 are imprinted, in a second nanoimprinting step, over microscale-layer pads that are not yet overlain with nanoscale PINU pads. As shown in FIG. 7J, an etching step may then be performed to etch through the $SiO_2$ layer to expose the microscale-layer pad underlying the nanoimprinted basins. As shown in FIG. 7K, a conductive layer 736 is next applied, and a liftoff process or two-step nanoimprint/conductive-layer removal process can then be used to produce a modified, first-nanoscale-sub-layer with conductive pillars, or vias 738, that rise up from the underlying microscale-layer pads to the surface of the modified, first-nanoscale-sub-layer.

As shown in FIG. 7M, nanowire-junction material 740 is next deposited on the surface of the nascent two-layer nanoscale/microscale interface. The nanowire-junction material may be, in certain embodiments, a variably resistive material that can reversibly transition between a relatively high conductivity state and a relatively low conductivity state upon application of two different voltages. Such material allows nanowire junctions to be configured electronically to either electrically interconnect the two nanowires that cross at the nanowire junction or to electrically isolate the two nanowires from one another. In alternative embodiments, alternative types of nanowire-junction materials may be deposited to produce alternative types of nanowire-junction components. In certain embodiments, multiple layers may be deposited in order to produce multi-layer nanowire junctions. Next, as shown in FIG. 7N, a thin layer of titanium 742 is deposited on the surface of the nascent two-layer nanoscale/microscale interface. Following deposition of the titanium, as shown in FIG. 7O, a second layer of nanoimprint resist 744 is deposited on the surface of the nascent two-layer nanoscale/microscale interface and cured.

In a third nanoimprinting step, as shown in FIG. 7P, the nanoimprint resist is stamped to produce troughs 747-749 and basins 750 in which second-nanoscale-layer nanowires and pads are subsequently formed. Then, as shown in FIG. 7Q, a second layer of conductive material 752 is deposited on the surface of the nascent two-layer nanoscale/microscale interface, the conductive material forming the PINUs of the second nanoscale sub-layer. In the described embodiment, platinum is again used for the second-sub-layer PINUs. Unwanted portions of the conductive layer and underlying nanoimprint resist are then removed by a second lift-off process, as shown in FIG. 7R, to produce a surface with exposed, second-nanoscale-level PINUs lying above a titanium coated surface. The nascent two-layer nanoscale/microscale interface can be etched to remove all non-PINU material down to the substrate surface, with nanowire-junction material and titanium remaining only below the second-nanoscale layer PINUs, where the nanowire-junction material and titanium layers are shielded from the etching process. This results in production of the two-layer nanoscale/microscale interface 754 shown in FIG. 7S. As shown in FIG. 7T, an additional $SiO_2$ layer may be applied, and polished, to produce a final two-layer nanoscale/microscale interface 756. The two-layer nanoscale/microscale interface may be additionally coated with protective layers or additional device layers, as needed for a particular application.

The process described above with respect to FIGS. 7A-T can be continued to form many additional layers, leading to a three-dimensional network of interconnection and active and passive nanoscale components spanning multiple nanoscale-sub-layers. The pad dimensions, nanowire dimensions, and other characteristics and parameters of the components and features of a given nanoscale sub-layer may be varied, as needed, to create the proper scale and density of interconnections for the given nanoscale sub-layer.

A two-layer nanoscale/microscale interface of the present invention can be characterized by a number of different parameters. Moreover, various embodiments of the present invention can be optimized for particular applications by optimizing one or more of these parameters with respect to various different criteria. One characterizing parameter is the angle θ by which PINUs are rotated with respect to a linear row of pad centers within a nanoscale sub-layer. FIG. 8 shows a rectilinear grid 802 of square microscale cells, such as microscale cell 804, each cell containing two different microscale pins, such as microscale pins 806-807 in microscale cell 804. The rectilinear grid 802 in FIG. 8 represents the predominantly microscale layer of a two-layer nanoscale/microscale interface above which the tessellated, predominantly nanoscale layer is fabricated. Assuming that the pad of a first-nanoscale-level PINU is to be fabricated above pin 808, the angle θ may be chosen to optimize the two-layer nanoscale/microscale interface. The numerous arrows emanating from pin 808, such as arrow 810, in FIG. 8 represent a few of the many choices for the angle θ with respect to the direction of the rows of pins within the rectilinear grid 802. In general, it is desirable to have nanowires as long as possible, in order to allow for placement of as many nanowires as possible in each channel. Maximizing the number of nanowires per channel in turn maximizes the potential connectivity between pins implemented within the predominantly microscale layer. A characteristic parameter of the two-layer nanoscale/microscale interface is a minimum distance of separation between a nanowire and any microscale pin other than the microscale pin on which the pad of the PINU including the nanowire is centered.

The maximum possible lengths of the nanowires emanating from a PINU positioned over pin 808 vary with θ. For example, in the direction represented by arrow 812, the nanowire would need to be relatively short, to avoid coming within a distance less than a minimum separation distance to any neighboring pin, such as neighboring pin 812. Approach of a nanowire to a neighboring microscale pin closer than a threshold minimum distance may result in a short within the predominantly nanoscale layer. In the rectilinear grid shown in FIG. 8, certain values of θ corresponding to the directions represented by arrows 810, 814, 816, and 818 are clearly more favorable than others, including those corresponding to the direction represented by arrow 812. The θ angles represented by arrows 810 and 818 correspond to the most favorable directions. In order to fabricate PINUs with longest-possible nanowires, one may seek to minimize the angle θ in order to, as closely as possible, align nanowires with the horizontal rows of pins, as represented by direction 810 in FIG. 8. In alternative embodiments of the present invention, the angle θ may be selected to be as close as possible to the direction indicated by arrow 818 in FIG. 8.

In the described embodiments of the present invention, each PINU has equal-length nanowires. Equal length nanowires are not required, but may be desirable for minimizing reactive-capacitance delays within the predominantly nanoscale layer for a particular degree of pin interconnection. The greater symmetry provided by equal-length nanowires may, in many applications, also facilitate routing of signals between microscale pins.

Another characteristic parameter for two-layer nanoscale/microscale interfaces of the present invention is the dimensions of PINU pads. In general, when the area of the pads is relatively small, a greater fraction of the area of the nanoscale layer can be devoted to nanowires and nanowire interconnections. Additional parameters include a minimal distance of separation between nanowires, the width of nanowires, dimensions of the microscale-layer pins, dimensions of the repeating units, or cells, that define the interface between the microscale and nanoscale layers, a minimum distance of separation between nanowires and pins, and parameters that characterize uncertainties and errors in alignment of the nanoscale layer to the microscale layer and in the positioning of features within each layer. All of these parameters affect the ultimate density of interconnection that can be achieved in various nanoscale/microscale-interface embodiments of the present invention. Certain of these parameters, such as the minimum separation distances between nanowires and between nanowires and pins and the nanowire widths may depend on the materials from which the nanoscale/microscale-interface embodiments of the present invention are fabricated, on the types of logic and interconnections implemented in the nanoscale layer, on the operational voltage and current levels within the nanoscale/microscale-interface embodiments, on the processes used to fabricate the nanoscale/microscale-interface embodiments of the present invention, and other such conditions, characteristics, and constraints. These various parameters can be analyzed and adjusted in order to find optimal dimensions, special organizations, and operational characteristics for particular applications of various different nanoscale/microscale-interface embodiments of the present invention.

Many different types of nanowire junctions can be fabricated within the nanoscale layer of a nanoscale/microscale interface. Bistable junctions can be used as conventional switches. It is also possible to fabricate nanowire junctions that behave as diodes, transistors, variable resistors, and that exhibit even more exotic behaviors and characteristics without analogs in microscale devices. Such a diverse palette of components types allows for implementation of digital and analog logic in the nanoscale layer, as well as self-modifying tuning and defect-compensating functionality that provides the nanoscale/microscale interface with an ability to be configured following manufacture and to configure itself, over time, to optimize performance and to compensate for defects. A circuit with sufficient built-in logic may monitor its performance and correctness of operation in order to work around defects that inevitably arise over time due to environmental and operational hazards, such as cosmic rays, material degradation, static charges, and transient voltage pulses.

As one example, variable-resistor-like nanowire junctions can be used to trim an integrated circuit. Resistance values for various variable-resistor nanowire junctions can be selected, for example, to adjust internal voltages to compensate for variances in other components and features of a circuit above tolerance thresholds that would otherwise cause the circuit to exhibit undesired behavior and characteristics or to completely fail. For example, a defective switch may transition from one state to another between 3 and 4 volts, instead of between 0 volts and 2 volts, resulting in the switch being stuck in only one state despite input voltages that vary between 0V and 2V, to which the defective switch was designed to respond. By trimming an upstream variable-resistance nanowire junction to a lower resistance value, the input voltages to the switch may be adjusted from between 0V and 2V to between 3V and 4V, so that the switch is appropriately responsive to the input voltages.

As further examples, configurable nanowire junctions may be used to shunt signals from a defective logic module to a redundant, equivalent module or to a newly configured, replacement module, in order to isolate the defective module. Test or monitor logic within an integrated circuit may, using spare cycles and resource, periodically or continuously monitor an integrated circuit to detect and compensate for defective or functionally deteriorating components and features, and to configure replacement components and features.

While monitor and repair of an integrated circuit, either as a result of internal testing and monitoring logic, or as a result of external testing and monitoring components, including human technician, can increase manufacturing yields and extend the useful lifetimes of integrated circuits, optimization logic within a mixed-scale-interface embodiment of the present invention may lead to more highly customized and operationally efficient integrated circuits, tuned to specific applications, than could be economically designed and manufactured by volume manufacturing processes. Over time, an integrated circuit may recognize and optimize operational patterns and heavily used functionality by reconfiguring itself to more efficiently carry out often repeated tasks, much like particular software routines may be specifically optimized and tuned beyond initial encoding produced by compilers from high-level languages. Furthermore, the electronic devices within which integrated circuits are used may themselves contain defects, or develop defects or degrade, over time, and a mixed-scale-interface embodiment of the present invention may reconfigure itself to compensate for such external defects and inefficiencies, either as a result of feedback provided by external testing and monitoring functionality, or by application-specific monitoring and testing logic configured into the mixed-scale interface in a post-manufacturing configuration process. Nanoscale layers of a mixed-scale interface provide for sufficient redundancy of interconnection and components, as well as stable, but reconfigurable components and features, to allow for effective and comprehensive post-manufacturing tuning, adjustment, and reconfiguration needed for self-modifying defect-compensating and optimization functionalities that can significantly improve manufacturing yields, application-specific customization, and useful lifetimes of integrated circuits.

Although the present invention has been described in terms of a particular embodiment, it is not intended that the invention be limited to this embodiment. Modifications within the spirit of the invention will be apparent to those skilled in the art. For example, as discussed above, an essentially limitless number of different types of nanoscale/microscale-interface embodiments of the present invention can be fabricated using any of many different fabrication methods to produce nanoscale/microscale interfaces with different characteristics, including different orientation angles of PINUs with respect to the microscale-cell-grid row directions, different microscale-cell grid geometries and dimensions, different nanoscale-layer patterns and spacing, different PINU dimensions, and other such characteristics. In alternative embodiments, 4-nanowire PINUs may be arranged in a regular, rectilinear array within the predominantly nanoscale layer of a nanoscale/microscale-interface. In other embodiments, 3-nanowire PINUs may be arranged in a hexagonal tiling patterns. In still additional embodiments, different types of PINUs may be combined to create more complex tilings with a variety of different symmetries.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

The invention claimed is:

1. A nanoscale/microscale interface comprising:
   a predominantly microscale layer with a surface having regularly patterned pins; and
   a predominantly nanoscale layer comprising an ordered arrangement of pad-interconnected nanowire units, a first pad of a pad-interconnected nanowire unit overlying a first pin of the predominantly microscale layer to electrically interconnect the first pin to a second pin through a pad-interconnected nanowire unit overlying the second pin and connected to the first pad-interconnected nanowire unit through a conductive nanowire junction.

2. The nanoscale/microscale interface of claim 1 wherein the pins have submicroscale or microscale dimensions.

3. The nanoscale/microscale interface of claim 1 wherein the pads of the pad-interconnected nanowire units have submicroscale or microscale dimensions.

4. The nanoscale/microscale interface of claim 1 wherein each pad-interconnected nanowire unit comprises a pad from which a number of nanowires emanate.

5. The nanoscale/microscale interface of claim 4 wherein two nanowires emanate, in opposite directions, from the pad of each pad-interconnected nanowire unit.

6. The nanoscale/microscale interface of claim 5 wherein the predominantly nanoscale layer includes a first sub-layer containing pad-interconnected nanowire units arranged to center the pads on parallel row lines at a fixed repeat distance, with each pad-interconnected nanowire unit rotated by a fixed angle $\theta$ with respect to the row line.

7. The nanoscale/microscale interface of claim 6 wherein the nanowires of the pad-interconnected nanowire units centered on a row line form parallel, closely spaced bundles of nanowires.

8. The nanoscale/microscale interface of claim 7 wherein the predominantly nanoscale layer includes a second sub-layer containing pad-interconnected nanowire units arranged to center the pads on parallel row lines at a fixed repeat distance, with each pad-interconnected nanowire unit rotated by a fixed angle $\theta$ with respect to the row line, the row lines of the second sub-layer oriented approximately orthogonally to the row lines of the first sub-layer.

9. The nanoscale/microscale interface of claim 8 wherein pads of pad-interconnected nanowire units of the first and second sub-layers overlie pins of the predominately microscale layer, with pads of pad-interconnected nanowire units of the first sub-layer arranged to form grid points of a first rectilinear grid and pads of pad-interconnected nanowire units of the second sub-layer arranged to form grid points of a second rectilinear grid offset from the first rectilinear grid so that each pad of pad-interconnected nanowire units of the second sub-layer are positioned at the center of a first rectilinear-grid cell.

10. The nanoscale/microscale interface of claim 9 wherein nanowire junctions at intersections between first sub-layer and second sub-layer pad-interconnected nanowire units are selectively configured to interconnect pairs of pins.

11. An integrated circuit comprising the nanoscale/microscale interface of claim 1 with additional microscale or submicroscale logic elements and functional components within the predominantly microscale layer.

* * * * *